United States Patent
Kuo et al.

(10) Patent No.: US 12,402,272 B2
(45) Date of Patent: Aug. 26, 2025

(54) SINGLE-PHASE IMMERSION COOLING SYSTEM AND METHOD OF THE SAME

(71) Applicant: Cooler Master Co., Ltd., Taipei (TW)

(72) Inventors: Sy chi Kuo, Taipei (TW); Yu lun Huang, Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 438 days.

(21) Appl. No.: 17/857,064

(22) Filed: Jul. 4, 2022

(65) Prior Publication Data

US 2022/0338373 A1 Oct. 20, 2022

Related U.S. Application Data

(63) Continuation-in-part of application No. 17/146,517, filed on Jan. 12, 2021, now Pat. No. 11,412,636.

(51) Int. Cl.
*H05K 7/20* (2006.01)

(52) U.S. Cl.
CPC ..... *H05K 7/20236* (2013.01); *H05K 7/20263* (2013.01); *H05K 7/20272* (2013.01)

(58) Field of Classification Search
CPC ........... H05K 7/20236; H05K 7/20263; H05K 7/20272; H01L 23/44; H01L 23/473; F28D 1/0206; F28D 1/024; F28D 2021/0029
See application file for complete search history.

(56) References Cited

U.S. PATENT DOCUMENTS

| | | | | |
|---|---|---|---|---|
| 2013/0020057 | A1* | 1/2013 | Suzuki | G06F 1/20 165/104.31 |
| 2015/0309546 | A1* | 10/2015 | Austin | H05K 7/20254 361/679.02 |
| 2015/0373882 | A1* | 12/2015 | Smith | H05K 7/20809 361/679.46 |
| 2016/0330865 | A1* | 11/2016 | Mathew | H05K 7/20781 |
| 2017/0127556 | A1* | 5/2017 | Smith | G06F 1/20 |
| 2017/0303442 | A1* | 10/2017 | Smith | G06F 1/20 |
| 2017/0354066 | A1* | 12/2017 | Kodama | H05K 7/20836 |
| 2018/0343774 | A1* | 11/2018 | Smith | G06F 1/206 |
| 2019/0383559 | A1* | 12/2019 | Aoki | F28D 1/05316 |

(Continued)

FOREIGN PATENT DOCUMENTS

JP 04170097 A * 6/1992 ......... H05K 7/20236

*Primary Examiner* — Nelson J Nieves
(74) *Attorney, Agent, or Firm* — Merchant & Gould P.C.

(57) ABSTRACT

A single-phase immersion cooling system, comprising a fluid-tight containment vessel, dielectric thermally conductive fluid, at least a heat-generating electronic device, and heat exchanger system is provided. The heat exchanger system comprises a pump, heat exchanger, at least a first conduit, at least a second conduit, stand, and at least a propulsion-like apparatus. The at least a first and second conduits have first and second modifiable portions comprising first and second openings. The first and second openings are disposed near to greatest opposing ends of the dielectric thermally conductive fluid contained within the fluid-tight containment vessel generating at least a first flow channel for directing a first flow of the dielectric thermally conductive fluid. The at least a propulsion-like apparatus moves the dielectric thermally conductive fluid from one face to an opposite face in the same direction as the first flow, supplementing and enhancing circulation within the fluid-tight containment vessel.

19 Claims, 14 Drawing Sheets

(56) References Cited

U.S. PATENT DOCUMENTS

| | | | |
|---|---|---|---|
| 2020/0257342 A1* | 8/2020 | Mao | H01M 10/6568 |
| 2020/0375059 A1* | 11/2020 | Keehn | H05K 7/20236 |
| 2020/0383237 A1* | 12/2020 | Hashimoto | H05K 7/20272 |
| 2022/0400580 A1* | 12/2022 | Fujimura | H02G 3/03 |
| 2023/0084765 A1* | 3/2023 | Gao | H05K 7/20254 |
| | | | 361/679.53 |
| 2023/0156959 A1* | 5/2023 | Malouin | H05K 7/20781 |
| | | | 361/699 |
| 2023/0292460 A1* | 9/2023 | Tokuda | H05K 7/20236 |
| 2023/0292473 A1* | 9/2023 | Sunaga | H05K 7/20236 |
| 2024/0074108 A1* | 2/2024 | Chehade | H05K 7/20327 |
| 2024/0081020 A1* | 3/2024 | Chen | H05K 7/20781 |

* cited by examiner

SINGLE-PHASE IMMERSION COOLING SYSTEM AND METHOD OF THE SAME

RELATED APPLICATIONS

This application is a continuation-in-part of U.S. nonprovisional patent application Ser. No. 17/146,517, filed Jan. 12, 2021, the contents of which are incorporated herein by reference as if fully disclosed herein.

TECHNICAL FIELD

Embodiments described herein relate generally to the field of heat transfer and, more particularly, to single-phase immersion cooling systems and methods for cooling electronic devices via circulating fluid in a fluid-tight containment vessel.

BACKGROUND

During operation of electric and electronic elements, devices and systems, the heat generated thereby, for example, by CPUs, processing units, or graphic boards, must be dissipated quickly and efficiently to keep operating temperature within manufacturer recommended ranges, under, at times, challenging operating conditions. As these elements, devices and systems increase in functionality and applicability, so does the power requirements thereof, and this in turn increases cooling requirements.

Several techniques have been developed for extracting heat from electric and electronic elements, devices and systems. One such technique is a liquid-cooling system, wherein a heat exchanger is in thermal contact with the elements, devices and/or systems, transporting heat away therefrom, and then cooling fluid, circulating within a cooling loop system incorporating the heat exchanger, flows over the heat exchanger by a pumping unit, removing heat therefrom. Heat is transferred from the heat source to the heat exchanger, the heat exchanger to the cooling fluid, and the cooling fluid to the environment by a radiator.

Generally, a maximum operating temperature of electric and electronic elements, devices and systems is defined and an appropriate liquid-cooling system dependent on a heat exchanger, radiator, and pump efficiency is provided. However, as operating temperatures increase so do costs, total installation time, risks for leakage, loss of parts, and total area requirements for the liquid-cooling systems. The increased costs, total installation time, risks for leakage, loss of parts, and total area requirements for the liquid-cooling systems are exacerbated when dispositions of the operating temperatures within the electric and electronic systems change.

SUMMARY

In an embodiment, a single-phase immersion cooling system, comprising a fluid-tight containment vessel, a dielectric thermally conductive fluid, at least a heat-generating electronic device, and a heat exchanger system is provided. The dielectric thermally conductive fluid is contained within the fluid-tight containment vessel and the at least a heat-generating electronic device is submerged within the dielectric thermally conductive fluid. The heat exchanger system comprises a pump, a heat exchanger, at least a first conduit, at least a second conduit, a stand, and at least a propulsion-like apparatus. The heat exchanger has a heat exchanger inlet and a heat exchanger outlet. The at least a first conduit has a first modifiable portion comprising a first opening submerged within the dielectric thermally conductive fluid. The at least a second conduit has a second modifiable portion comprising a second opening submerged within the dielectric thermally conductive fluid.

At least one of the at least a first conduit or second conduit circulates dielectric thermally conductive fluid from the heat exchanger outlet into the dielectric thermally conductive fluid contained within the fluid-tight containment vessel and the other of the first conduit or second conduit circulates dielectric thermally conductive fluid contained within the fluid-tight containment vessel thereout to the heat exchanger inlet via the pump. The first and second openings are disposed near to greatest opposing ends of the dielectric thermally conductive fluid contained within the fluid-tight containment vessel. The at least a propulsion-like apparatus is configured to supplement and enhance the circulation of dielectric thermally conductive fluid contained within the fluid-tight containment vessel.

In certain embodiments, the disposition of the first and second openings generate at least a first flow channel for directing a first flow of the dielectric thermally conductive fluid contained within the fluid-tight containment vessel.

In certain embodiments, the at least a propulsion-like apparatus is disposed between the first and second openings supplementing and enhancing the circulation of dielectric thermally conductive fluid contained within the fluid-tight containment vessel.

In certain embodiments, the at least a propulsion-like apparatus converts rotational movement to thrust to move dielectric thermally conductive fluid from one face of the at least a propulsion-like apparatus to an opposite face of the at least a propulsion-like apparatus. The direction of the at least a first flow channel for directing the first flow of the dielectric thermally conductive fluid contained within the fluid-tight containment vessel is the same as the direction of thrust moving dielectric thermally conductive fluid from one face of the at least a propulsion-like apparatus to the opposite face of the at least a propulsion-like apparatus.

The single-phase immersion cooling system efficiently cools the at least a heat-generating electronic device, as an example, such as heat-generating electric and/or electronic elements, devices and/or systems, decreasing a requirement for and/or requirement for an amount of cooling components, as an example, such as interface materials, heat sinks, heat sink fins, and fans etc., for cooling thereof, decreasing costs, total installation time, and total area requirements.

In some embodiments, the fluid-tight containment vessel comprises a containment vessel having a vessel opening and a containment cover configured to fluid-tight mount to the vessel opening. The dielectric thermally conductive fluid, at least a heat-generating electronic device, and first and second openings are contained within the fluid-tight containment vessel via the vessel opening.

The fluid-tight containment vessel comprising the containment vessel having the vessel opening and the containment cover configured to fluid-tight mount to the vessel opening, easily and simply provide access to a user for filling of the dielectric thermally conductive fluid, decreasing total installation time.

The single-phase immersion cooling system decreases risks for leakage as risks for a liquid-cooling system having a heat exchanger in thermal contact with the electric and/or electronic elements, devices and/or systems, transporting heat away therefrom are greater, due to leakage along any one of conduits, mounting portions, and heat exchangers of the liquid-cooling system causing damage to the non-submersible electric and/or electronic elements, devices and/or systems. The fluid-tight containment vessel also prevents contact of the heat-generating electric and/or electronic elements, devices and/or systems during operation with the surrounding environment, decreasing damage due to high temperature, high humidity, oily or dusty air, and/or salty coastal area environments.

In some embodiments, the single-phase immersion cooling system further comprises at least a fluid-tight first conduit access entrance and at least a fluid-tight second conduit access entrance. The at least a fluid-tight first conduit access entrance is through the fluid-tight containment vessel and is configured to provide at least the first conduit from an exterior of the fluid-tight containment vessel to an interior of the fluid-tight containment vessel for access to the dielectric thermally conductive fluid contained within the fluid-tight containment vessel. The at least a fluid-tight second conduit access entrance is through the fluid-tight containment vessel and configured to provide at least the second conduit from an exterior of the fluid-tight containment vessel to an interior of the fluid-tight containment vessel for access to the dielectric thermally conductive fluid contained within the fluid-tight containment vessel.

In some embodiments, the at least a heat-generating electronic device comprises at least one of a motherboard, printed circuit board, central processing unit, graphics processing unit, memory, storage device, or lighting, or any combination of the foregoing.

In some embodiments, the single-phase immersion cooling system further comprises at least a fluid-tight cable access entrance through the fluid-tight containment vessel. The at least a fluid-tight cable access entrance is configured to provide at least one of a control cable, data cable, communications cable, or signal cable, or any combination of the foregoing, from an exterior of the fluid-tight containment vessel to an interior of the fluid-tight containment vessel for further access to the at least a heat-generating electronic device.

In some embodiments, the single-phase immersion cooling system further comprises a power supply unit submerged within the dielectric thermally conductive fluid. The power supply unit is configured to provide power to the at least a heat-generating electronic device, wherein the at least a fluid-tight cable access entrance through the fluid-tight containment vessel is further configured to provide at least a power cable from an exterior of the fluid-tight containment vessel to an interior of the fluid-tight containment vessel for further access to the power supply unit.

The fluid-tight cable and conduit access entrances provides easy and simple mounting and access to a user for control cables, data cables, communications cables, signal cables, and/or power cables, from the exterior of the fluid-tight containment vessel to the interior of the fluid-tight containment vessel for access to the at least a heat-generating electronic device and/or power supply unit, respectively.

In some embodiments, the single-phase immersion cooling system further comprises a removable bracket structure disposed and mounted within the fluid-tight containment vessel, configured for mounting of the power supply unit and the at least a heat-generating electronic device thereto.

The removable bracket structure disposed and mounted within the fluid-tight containment vessel, configured for mounting of the heat-generating electric and/or electronic elements, devices and/or systems thereto, easily and simply provide access to a user for mounting of the heat-generating electric and/or electronic elements, devices and/or systems, decreasing total installation time.

In certain embodiments, the single-phase immersion cooling system further comprises at least a first conduit having a third modifiable portion and at least a second conduit having a fourth modifiable portion. The third modifiable portion comprises a third opening submerged within the dielectric thermally conductive fluid and the fourth modifiable portion comprises a fourth opening submerged within the dielectric thermally conductive fluid. The first modifiable portion is dismounted from the at least a first conduit and the third modifiable portion is mounted to the at least a first conduit and the second modifiable portion is dismounted from the at least a second conduit and the fourth modifiable portion is mounted to the at least a second conduit. At least one of the first conduit or second conduit circulates dielectric thermally conductive fluid from the heat exchanger outlet into the dielectric thermally conductive fluid contained within the fluid-tight containment vessel and the other of the first conduit or second conduit circulates dielectric thermally conductive fluid contained within the fluid-tight containment vessel thereout to the heat exchanger inlet via the pump. The third and fourth openings are disposed near to greatest opposing ends of the dielectric thermally conductive fluid contained within the fluid-tight containment vessel which are different from that of the disposition of the first and second openings. The lengths and shapes of the first and third modifiable portions and lengths and shapes of the second and fourth modifiable portions are different, respectively, and the disposition of the third and fourth openings generate at least a third flow channel, different from the first flow channel, for directing a third flow of the dielectric thermally conductive fluid contained within the fluid-tight containment vessel. The at least a propulsion-like apparatus is disposed between the first and second openings supplementing and enhancing the circulation of dielectric thermally conductive fluid contained within the fluid-tight containment vessel.

In certain embodiments, the single-phase immersion cooling system further comprises at least a first conduit having a fifth modifiable portion and at least a second conduit having a fourth modifiable portion. The fifth modifiable portion comprises a fifth opening submerged within the dielectric thermally conductive fluid and the fourth modifiable portion comprises a fourth opening submerged within the dielectric thermally conductive fluid. The first modifiable portion is dismounted from the at least a first conduit and the fifth modifiable portion is mounted to the at least a first conduit and the second modifiable portion is dismounted from the at least a second conduit and the fourth modifiable portion is mounted to the at least a second conduit. At least one of the first conduit or second conduit circulates dielectric thermally conductive fluid from the heat exchanger outlet into the dielectric thermally conductive fluid contained within the fluid-tight containment vessel and the other of the first conduit or second conduit circulates dielectric thermally conductive fluid contained within the fluid-tight containment vessel thereout to the heat exchanger inlet via the pump. The fifth and fourth openings are disposed near to greatest opposing ends of the dielectric thermally conductive fluid contained within the fluid-tight containment vessel which are different from that of the disposition of the first and second openings. The lengths and shapes of the first and fifth modifiable portions and lengths and shapes of the second and fourth modifiable portions are different, respectively, and the disposition of the fifth and fourth openings generate at least a fifth flow channel, different from the first flow channel, for directing a fifth flow of the dielectric thermally conductive fluid contained within the fluid-tight containment vessel. The at least a propulsion-like apparatus is disposed between the first and second openings supplementing and enhancing the circulation of dielectric thermally conductive fluid contained within the fluid-tight containment vessel.

In certain embodiments, the pump of the single-phase immersion cooling system is submerged within the dielectric thermally conductive fluid within the fluid-tight containment vessel. In certain embodiments, the pump of the single-phase immersion cooling system is mounted to an outer side of the fluid-tight containment vessel.

In certain embodiments, the heat exchanger of the single-phase immersion cooling system comprises a heat exchanger radiator, mounted to an outer side of the fluid-tight containment vessel. In certain embodiments, the heat exchanger of the single-phase immersion cooling system further comprises at least a fan unit mounted to the heat exchanger radiator, opposite to the outer side of the fluid-tight containment vessel. In certain embodiments, the heat exchanger radiator of the single-phase immersion cooling system comprises at least a built-in fluid tank reservoir having a reservoir opening, whereby dielectric thermally conductive fluid is added into the built-in fluid tank reservoir.

In some embodiments, the dielectric thermally conductive fluid of the single-phase immersion cooling system comprises a single-phase fluid. In some embodiments, the fluid-tight containment vessel of the single-phase immersion cooling system comprises at least one of a metal, plastic, or transparent plastic material, or any combination of the foregoing.

In an embodiment, a single-phase immersion cooling method, comprising providing a single-phase immersion cooling system and circulating a dielectric thermally conductive fluid therewithin is provided. The single-phase immersion cooling method comprises providing the single-phase immersion cooling system including providing a fluid-tight containment vessel, providing a dielectric thermally conductive fluid contained within the fluid-tight containment vessel, providing at least a heat-generating electronic device submerged within the dielectric thermally conductive fluid, and providing a heat exchanger system. The heat exchanger system of the method comprises a pump, a heat exchanger having a heat exchanger inlet and a heat exchanger outlet, at least a first conduit having a first modifiable portion comprising a first opening submerged within the dielectric thermally conductive fluid, at least a second conduit having a second modifiable portion comprising a second opening submerged within the dielectric thermally conductive fluid a stand, and at least a propulsion-like apparatus mounted to the stand. The method further comprises circulating, via the pump, and supplementing and enhancing via the at least a propulsion-like apparatus, dielectric thermally conductive fluid from the heat exchanger outlet into the dielectric thermally conductive fluid contained within the fluid-tight containment vessel through at least one of the first conduit or second conduit and circulating, via the pump, dielectric thermally conductive fluid contained within the fluid-tight containment vessel thereout to the heat exchanger inlet through the other of the first conduit or second conduit. The first and second openings of the method are disposed near to greatest opposing ends of the dielectric thermally conductive fluid contained within the fluid-tight containment vessel. The at least a propulsion-like apparatus supplements and enhances the circulation of dielectric thermally conductive fluid contained within the fluid-tight containment vessel.

In certain embodiments of the method, the method further comprises generating at least a first flow channel for directing a first flow of the dielectric thermally conductive fluid contained within the fluid-tight containment vessel via the disposition of the first and second openings.

In certain embodiments of the method, the method further comprises providing at least a first conduit having a third modifiable portion comprising a third opening submerged within the dielectric thermally conductive fluid and providing at least a second conduit having a fourth modifiable portion comprising a fourth opening submerged within the dielectric thermally conductive fluid. The method further comprises dismounting the first modifiable portion from the at least a first conduit and mounting the third modifiable portion to the at least a first conduit and dismounting the second modifiable portion from the at least a second conduit and mounting the fourth modifiable portion to the at least a second conduit. Also, the method further comprises circulating, via the pump, dielectric thermally conductive fluid from the heat exchanger outlet into the dielectric thermally conductive fluid contained within the fluid-tight containment vessel through at least one of the first conduit or second conduit and circulating, via the pump, dielectric thermally conductive fluid contained within the fluid-tight containment vessel thereout to the heat exchanger inlet through the other of the first conduit or second conduit. The single-phase immersion cooling method further comprises generating at least a third flow channel for directing a third flow of the dielectric thermally conductive fluid contained within the fluid-tight containment vessel via the disposition of the third and fourth openings. The third and fourth openings of the single-phase immersion cooling method are disposed near to greatest opposing ends of the dielectric thermally conductive fluid contained within the fluid-tight containment vessel which are different from that of the disposition of the first and second openings, whereby the lengths and shapes of the first and third modifiable portions and lengths and shapes of the second and fourth modifiable portions are different, respectively.

In certain embodiments of the method, the method further comprises providing at least a first conduit having a fifth modifiable portion comprising a fifth opening submerged within the dielectric thermally conductive fluid and providing at least a second conduit having a fourth modifiable portion comprising a fourth opening submerged within the dielectric thermally conductive fluid. The method further comprises dismounting the first modifiable portion from the at least a first conduit and mounting the fifth modifiable portion to the at least a first conduit and dismounting the second modifiable portion from the at least a second conduit and mounting the fourth modifiable portion to the at least a second conduit. Also, the method further comprises circulating, via the pump, dielectric thermally conductive fluid from the heat exchanger outlet into the dielectric thermally conductive fluid contained within the fluid-tight containment vessel through at least one of the first conduit or second conduit and circulating, via the pump, dielectric thermally conductive fluid contained within the fluid-tight containment vessel thereout to the heat exchanger inlet through the other of the first conduit or second conduit. The single-phase immersion cooling method further comprises generating at least a fifth flow channel for directing a fifth flow of the dielectric thermally conductive fluid contained within the fluid-tight containment vessel via the disposition of the fifth and fourth openings. The fifth and fourth openings of the single-phase immersion cooling method are disposed near to greatest opposing ends of the dielectric thermally conductive fluid contained within the fluid-tight containment vessel which are different from that of the disposition of the first and second openings, whereby the lengths and shapes of the first and fifth modifiable portions and lengths and shapes of the second and fourth modifiable portions are different, respectively.

The modifiable portions of the at least a first and second conduits, having different and/or same lengths and different and/or same shapes, in any combination, easily and conveniently allow users to exchange an insurmountable amount of modifiable portions, each having openings, of the heat exchanger system, to form an insurmountable amount of different flow channels for directing a flow of the dielectric thermally conductive fluid contained within the fluid-tight containment vessel via the disposition of the openings. The increased costs, total installation time, risks for leakage, loss of parts, and total area requirements for the single-phase immersion cooling system are not exacerbated when dispositions of the operating temperatures within the electric and/or electronic elements, devices and/or systems change, as easy and simple dismounting and mounting of appropriate modifiable portions easily and simply adjust the flow of the dielectric thermally conductive fluid contained within the fluid-tight containment vessel via the disposition of the openings for a most optimal transfer of heat.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of heat exchanger systems incorporating aspects of the presently disclosed principles are illustrated by way of example, and not by way of limitation.

DETAILED DESCRIPTION

Figure 1A:
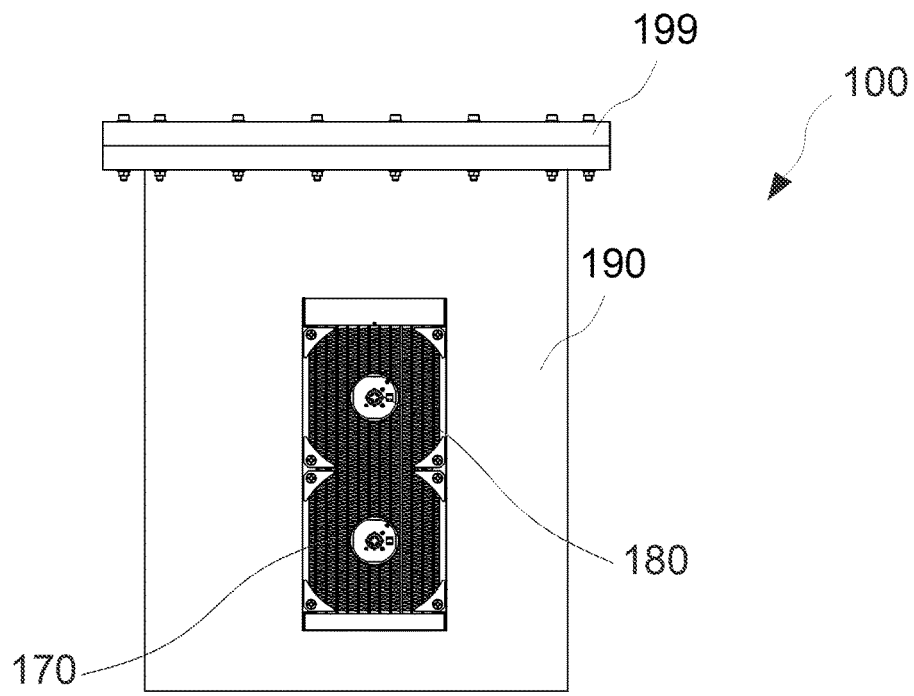
FIG. 1A depicts a representation of an embodiment of a single-phase immersion cooling system.

The following describes various principles related to single-phase immersion cooling systems and methods by way of reference to specific examples of fluid-tight containment vessels, dielectric thermally conductive fluids, heat-generating electronic devices, and heat exchanger systems, including specific arrangements and examples of vessels, fluids, pumps, radiators, propulsion-like apparatuses, and conduits having modifiable portions, each comprising openings, embodying innovative concepts. More particularly, but not exclusively, such innovative principles are described in relation to selected examples of vessels, fluids, pumps, radiators, propulsion-like apparatuses, and conduits having modifiable portions, each comprising openings and well-known functions or constructions are not described in detail for purposes of succinctness and clarity. Nonetheless, one or more of the disclosed principles can be incorporated in various other embodiments of vessels, fluids, pumps, radiators, propulsion-like apparatuses, and conduits having modifiable portions, each comprising openings to achieve any of a variety of desired outcomes, characteristics, and/or performance criteria.

Thus, vessels, fluids, pumps, radiators, propulsion-like apparatuses, and conduits having modifiable portions, each comprising openings having attributes that are different from those specific examples discussed herein can embody one or more of the innovative principles, and can be used in applications not described herein in detail. Accordingly, embodiments of vessels, fluids, pumps, radiators, propulsion-like apparatuses, and conduits having modifiable portions, each comprising openings not described herein in detail also fall within the scope of this disclosure, as will be appreciated by those of ordinary skill in the relevant art following a review of this disclosure.

Example embodiments as disclosed herein are directed to single-phase immersion cooling systems and methods of the same, wherein a heat exchanger system circulates non-heated dielectric thermally conductive fluid from a heat exchanger outlet into a dielectric thermally conductive fluid contained within a fluid-tight containment vessel and circulates heated dielectric thermally conductive fluid contained within the fluid-tight containment vessel thereout to a heat exchanger inlet through conduits, respectively, via a pump, supplemented and enhanced by a propulsion-like apparatus, efficiently cooling heat-generating electric and/or electronic elements, devices and/or systems submerged within the dielectric thermally conductive fluid. The dielectric thermally conductive fluid is in direct thermal contact with the electric and/or electronic elements, devices and/or systems, and a flow channel for directing a flow of the non-heated and heated dielectric thermally conductive fluid contained within the fluid-tight containment vessel is generated for heat transfer. The flow channel is modified by users, depending upon the disposition and amount of heat generated from the electric and/or electronic elements, devices and/or systems for efficacy, via different and/or same lengths and different and/or same shapes of modifiable portions of the conduits.

In an embodiment, a single-phase immersion cooling system, comprising a fluid-tight containment vessel, dielectric thermally conductive fluid, at least a heat-generating electronic device, and heat exchanger system is provided. The heat exchanger system comprises a pump, heat exchanger, at least a first conduit, at least a second conduit, a stand, and at least a propulsion-like apparatus. The at least a first and second conduits have first and second modifiable portions comprising first and second openings submerged within the dielectric thermally conductive fluid, respectively. At least one of the at least a first conduit or second conduit circulates dielectric thermally conductive fluid from a heat exchanger outlet into the fluid-tight containment vessel and the other of the first conduit or second conduit circulates dielectric thermally conductive fluid from the fluid-tight containment vessel to a heat exchanger inlet via the pump. The first and second openings are disposed near to greatest opposing ends of the dielectric thermally conductive fluid contained within the fluid-tight containment vessel.

Figure 1B:
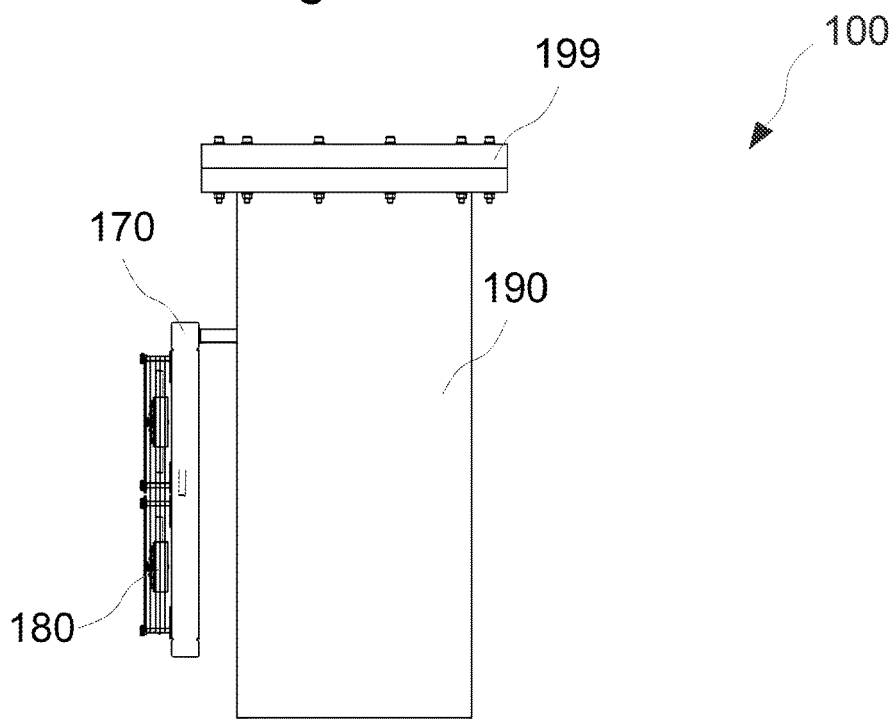
FIG. 1B depicts a representation of the embodiment of the single-phase immersion cooling system of FIG. 1A.

In an embodiment, a single-phase immersion cooling system 100, comprising a fluid-tight containment vessel 190, 199, a dielectric thermally conductive fluid (not shown), at least a heat-generating electronic device 150, 155, and a heat exchanger system is provided. FIG. 1A depicts a representation of an embodiment of a single-phase immersion cooling system. FIG. 1B depicts a representation of the embodiment of the single-phase immersion cooling system of FIG. 1A.

Figure 2A:
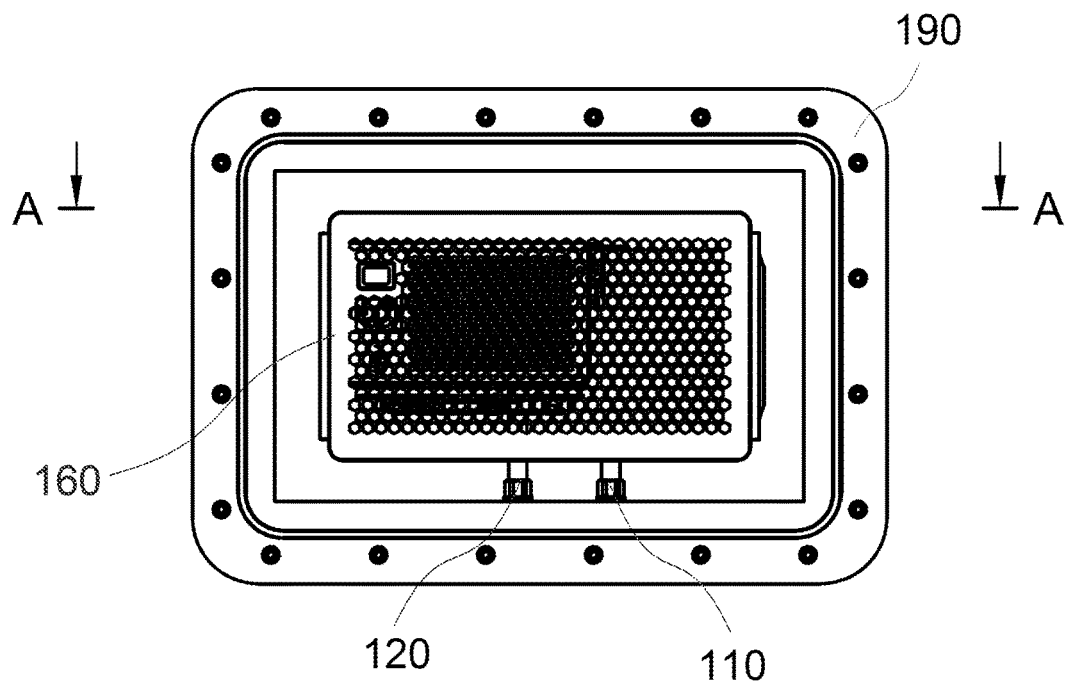
FIG. 2A depicts a representation of an embodiment of a single-phase immersion cooling system without a containment cover.
Figure 2B:
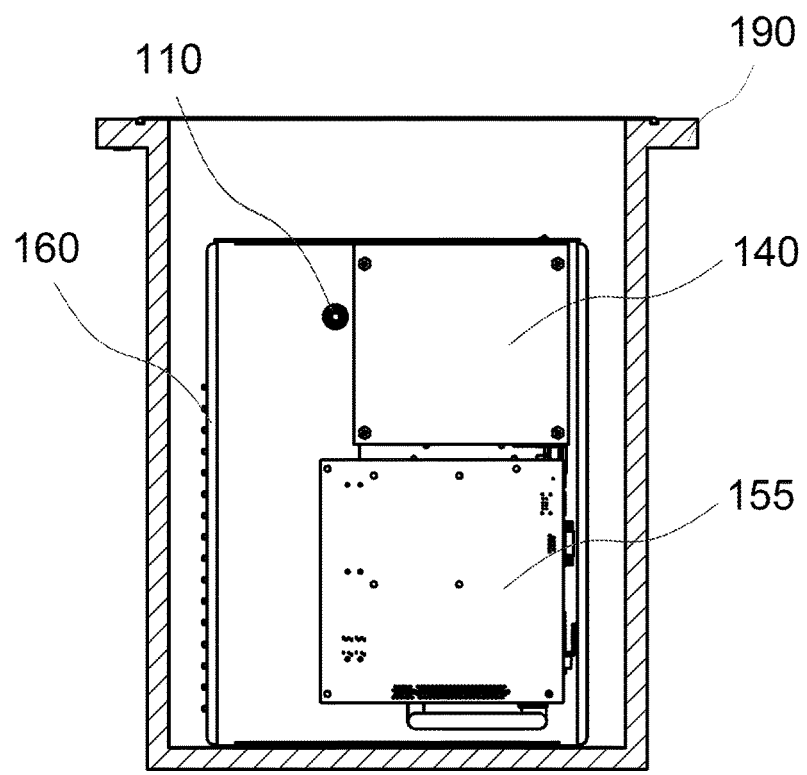
FIG. 2B depicts a cross-sectional view of the embodiment of the single-phase immersion cooling system along line A-A of FIG. 2A.
Figure 3A:
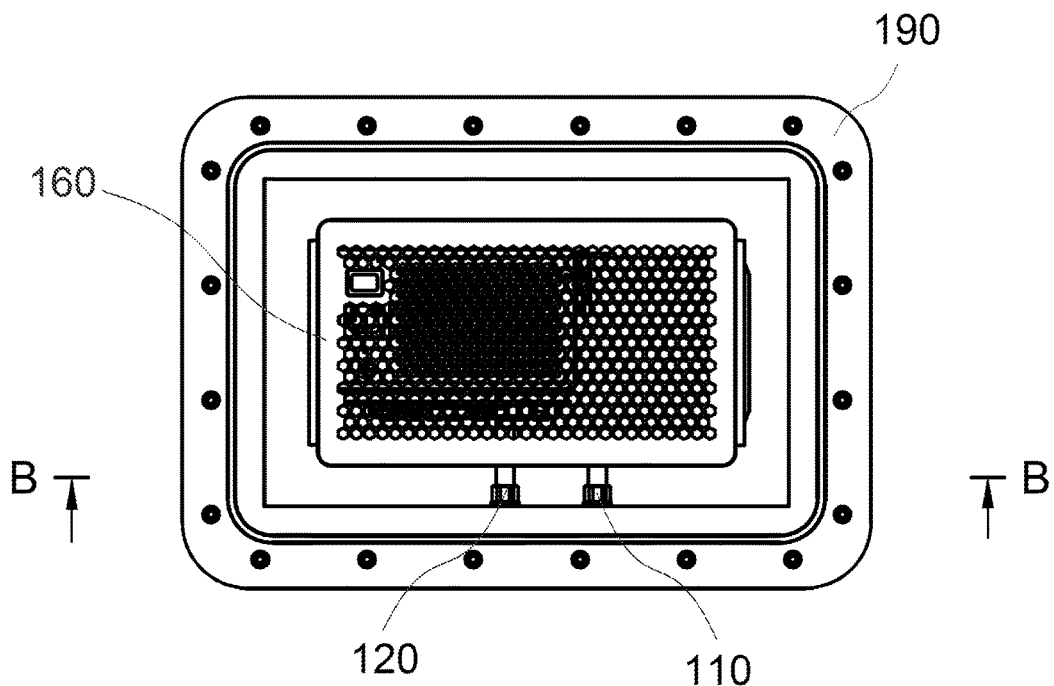
FIG. 3A depicts a representation of an embodiment of a single-phase immersion cooling system without a containment cover.
Figure 3B:
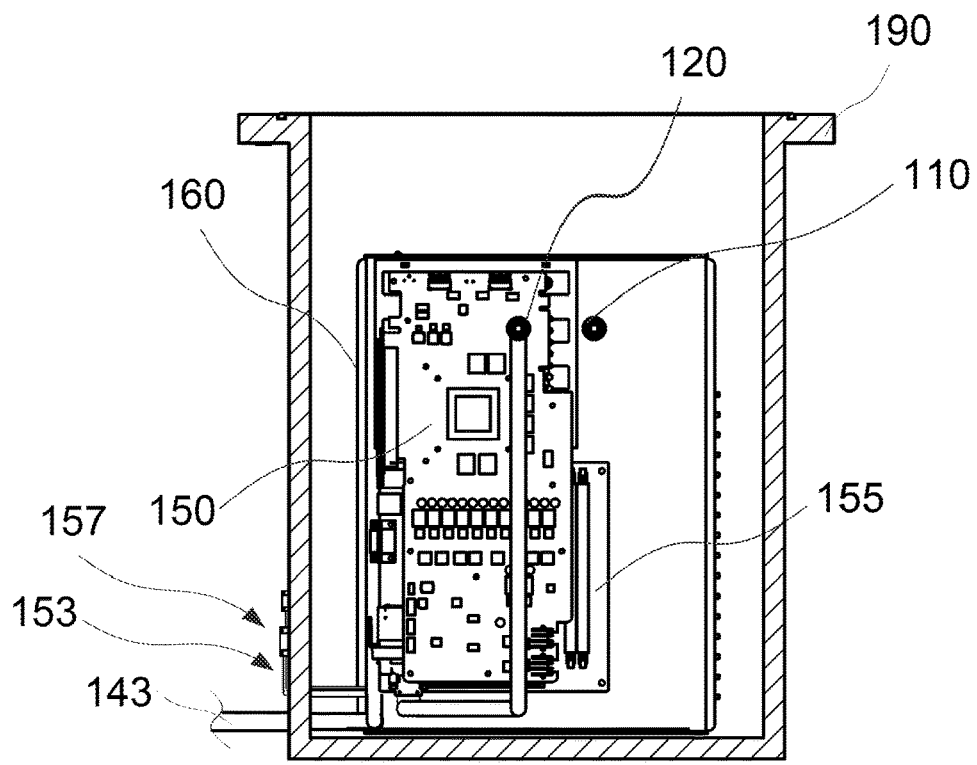
FIG. 3B depicts a cross-sectional view of the embodiment of the single-phase immersion cooling system along line B-B of FIG. 3A.
Figure 4:
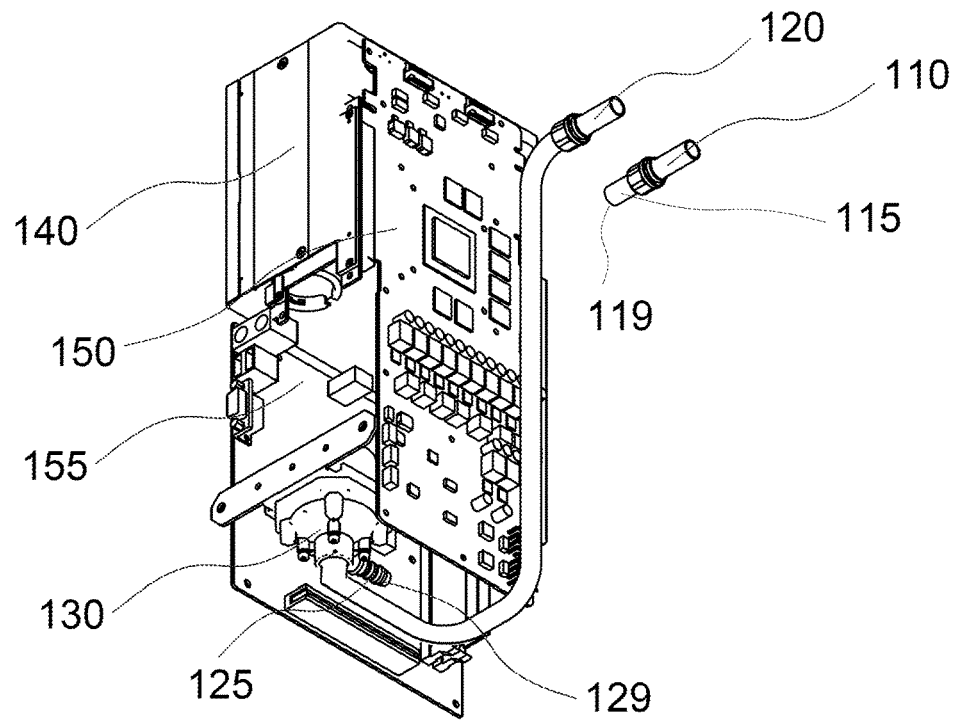
FIG. 4 depicts a representation of an embodiment of conduits, a pump, a power supply unit, a motherboard and a printed circuit board.
Figure 5:
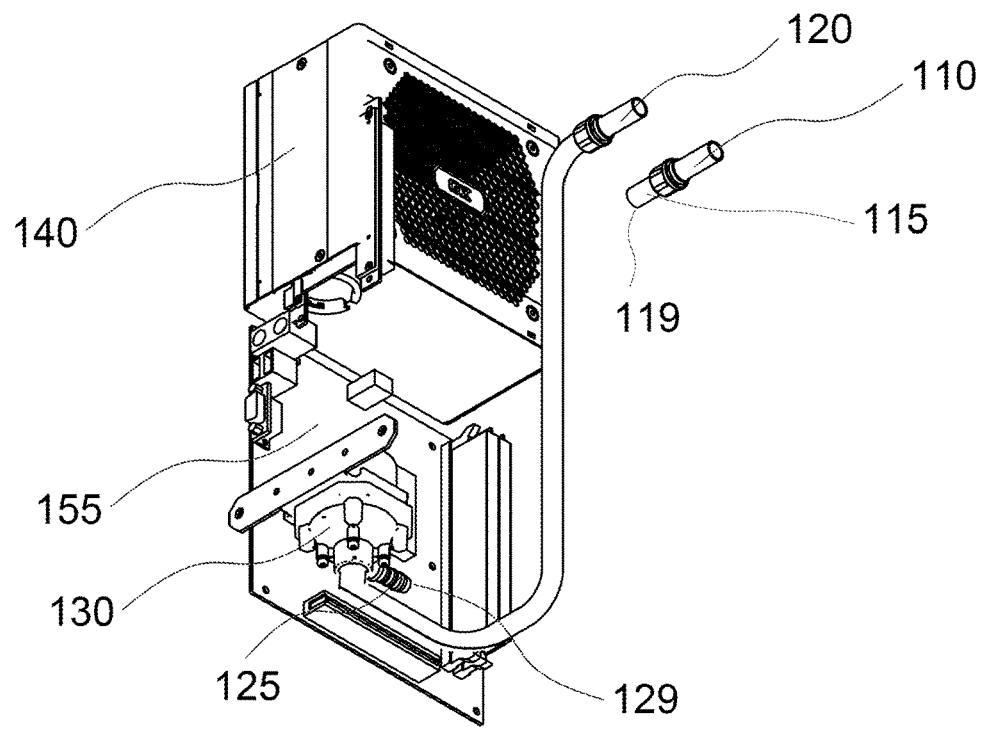
FIG. 5 depicts a representation of an embodiment of conduits, a pump, a power supply unit and a printed circuit board.
Figure 6:
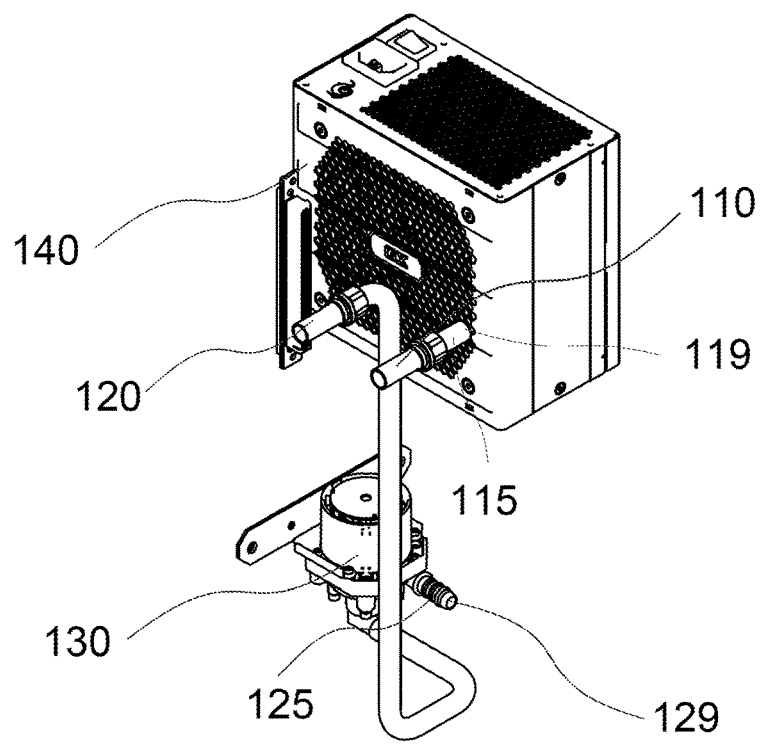
FIG. 6 depicts a representation of an embodiment of conduits, a pump, and a power supply unit.

FIG. 2A depicts a representation of an embodiment of a single-phase immersion cooling system without a containment cover. FIG. 2B depicts a cross-sectional view of the embodiment of the single-phase immersion cooling system along line A-A of FIG. 2A. FIG. 3A depicts a representation of an embodiment of a single-phase immersion cooling system without a containment cover. FIG. 3B depicts a cross-sectional view of the embodiment of the single-phase immersion cooling system along line B-B of FIG. 3A. FIG. 4 depicts a representation of an embodiment of conduits, a pump, a power supply unit, a motherboard and a printed circuit board. FIG. 5 depicts a representation of an embodiment of conduits, a pump, a power supply unit and a printed circuit board. FIG. 6 depicts a representation of an embodiment of conduits, a pump, and a power supply unit. Referring to FIGS. 1A to 6, the dielectric thermally conductive fluid (not shown) is contained within the fluid-tight containment vessel 190, 199 and the at least a heat-generating electronic device 150, 155 is submerged within the dielectric thermally conductive fluid. The heat exchanger system comprises a pump 130, a heat exchanger 170, at least a first conduit 110, and at least a second conduit 120. The heat exchanger 170 has a heat exchanger inlet and a heat exchanger outlet. The at least a first conduit 110 has a first modifiable portion 115 comprising a first opening 119 submerged within the dielectric thermally conductive fluid. The at least a second conduit 120 has a second modifiable portion 125 comprising a second opening 129 submerged within the dielectric thermally conductive fluid.

At least one of the at least a first conduit 110 or second conduit 120 circulates dielectric thermally conductive fluid from the heat exchanger outlet into the dielectric thermally conductive fluid contained within the fluid-tight containment vessel 190, 199 and the other of the first conduit 110 or second conduit 120 circulates dielectric thermally conductive fluid contained within the fluid-tight containment vessel 190, 199 thereout to the heat exchanger inlet via the pump 130. The first and second opening 119, 129 are disposed near to greatest opposing ends of the dielectric thermally conductive fluid contained within the fluid-tight containment vessel 190, 199.

Figure 7A:
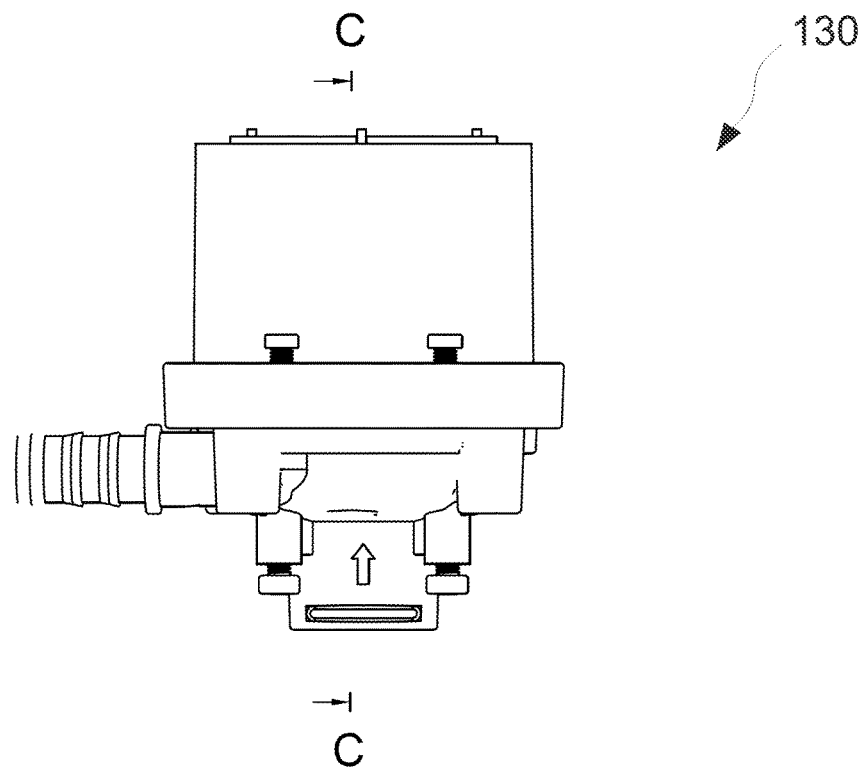
FIG. 7A depicts a representation of an embodiment of a pump.
Figure 7B:
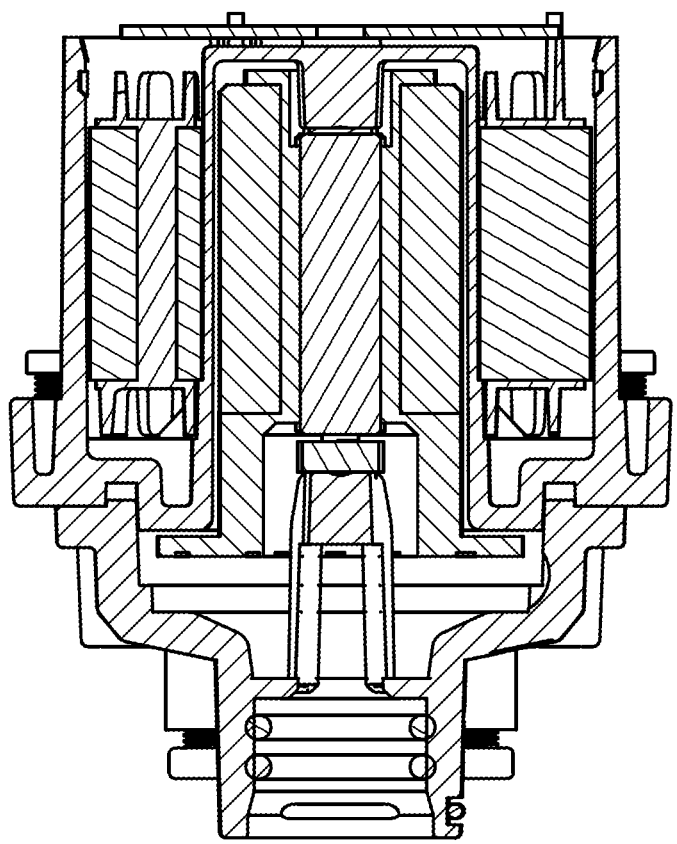
FIG. 7B depicts a cross-sectional view of the embodiment of the pump along line C-C of FIG. 7A.

FIG. 7A depicts a representation of an embodiment of a pump. FIG. 7B depicts a cross-sectional view of the embodiment of the pump along line C-C of FIG. 7A. Referring to FIGS. 7A and 7B, and referring to FIGS. 1A to 6, it is readily appreciated that any suitable type, style, size, and amount of pump 130 may be implemented by those of ordinary skill in the relevant art within the single-phase immersion cooling system 100 and the embodiments are not limited thereto. As long as dielectric thermally conductive fluid is circulated from an outlet of the heat exchanger radiator 170 into the dielectric thermally conductive fluid contained within the fluid-tight containment vessel 190, 199 through a conduit 110, 120, and dielectric thermally conductive fluid contained within the fluid-tight containment vessel 190, 199 is circulated thereout to an inlet of the heat exchanger radiator 170 through an other conduit 110, 120, via the pump 130, efficiently cooling the heat-generating electric and/or electronic elements, devices and/or systems, submerged within the dielectric thermally conductive fluid.

In certain embodiments, the disposition of the first and second opening 119, 129 generate at least a first flow channel for directing a first flow of the dielectric thermally conductive fluid contained within the fluid-tight containment vessel 190, 199.

The single-phase immersion cooling system 100 efficiently cools the at least a heat-generating electronic device 150, 155, as an example, such as heat-generating electric and/or electronic elements, devices and/or systems, decreasing a requirement for and/or requirement for an amount of cooling components, as an example, such as interface materials, heat sinks, heat sink fins, and fans etc., for cooling thereof, decreasing costs, total installation time, and total area requirements.

It is readily appreciated that any suitable type, style, size, length, material and amount of conduit 110, 120 may be implemented by those of ordinary skill in the relevant art within the single-phase immersion cooling system 100 and the embodiments are not limited thereto. Examples of conduit materials comprise fixed shaped galvanized steel, PVC and polyethylene etc. As long as the first and second opening 119, 129 generate at least a steady flow channel for directing a steady flow of the dielectric thermally conductive fluid contained within the fluid-tight containment vessel 190, 199.

In certain embodiments, the pump 130 of the single-phase immersion cooling system 100, together with the disposition of the first and second opening 119, 129, generate at least a first flow channel for directing a first flow of the dielectric thermally conductive fluid contained within the fluid-tight containment vessel 190, 199, however, the embodiments are not limited thereto. Those having ordinary skill in the relevant art may readily appreciate that apparatuses and devices that supplement and enhance the at least a first flow channel for directing the first flow of the dielectric thermally conductive fluid contained within the fluid-tight containment vessel 190, 199, may also be implemented in the embodiments.

Figure 8:
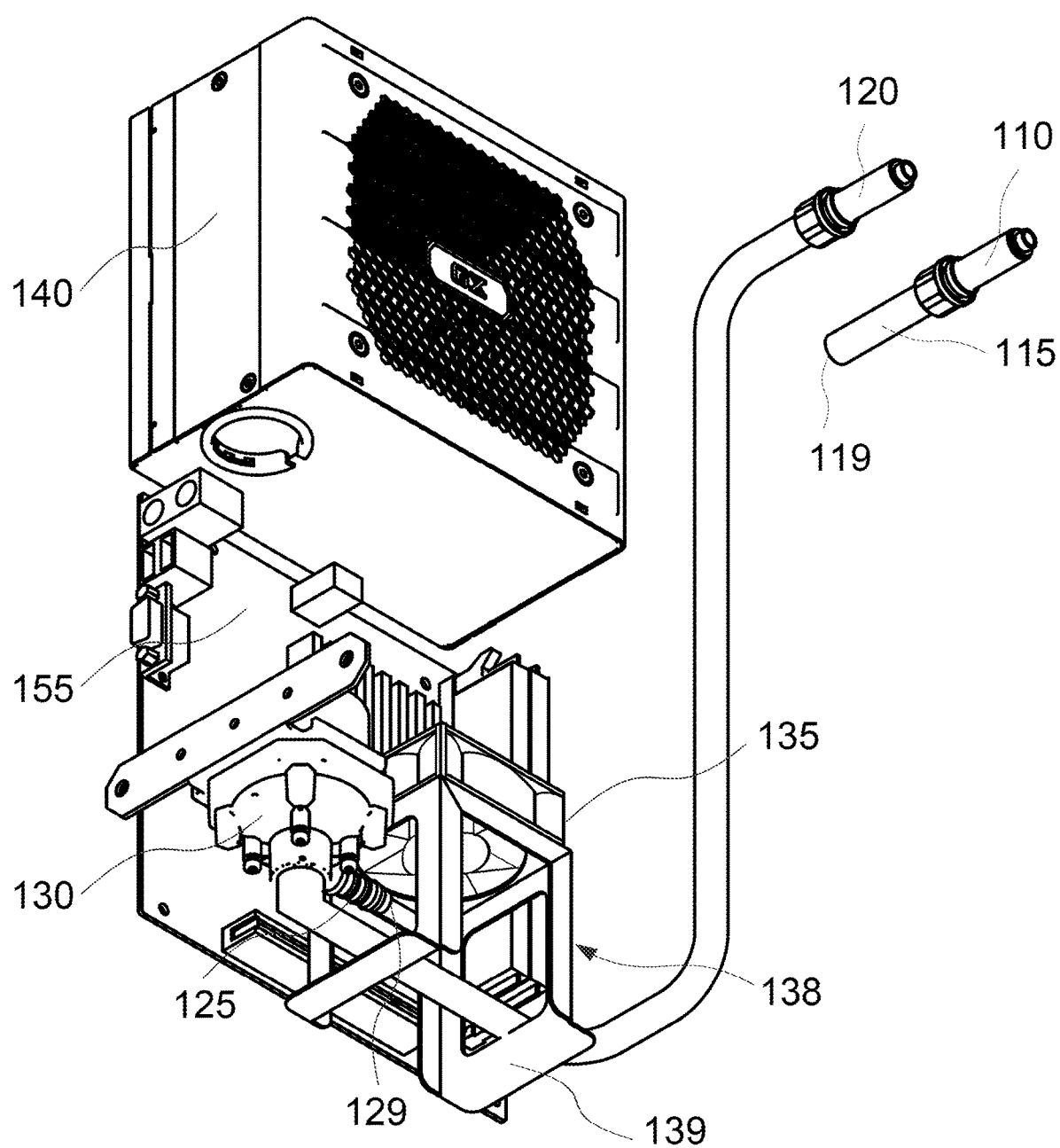
FIG. 8 depicts a representation of an embodiment of conduits, a pump, a power supply unit, a printed circuit board and a propulsion-like apparatus.

FIG. 8 depicts a representation of an embodiment of conduits, a pump, a power supply unit, a printed circuit board and a propulsion-like apparatus. Referring to FIG. 8, and referring to FIGS. 1A-7B, the single-phase immersion cooling system 100 of FIGS. 1A-7B may be similar in some respects to the single-phase immersion cooling system of FIG. 8, and thus may be best understood with reference thereto where like numerals designate like components not described again in detail. Unlike the single-phase immersion cooling system 100 of FIGS. 1A-7B, the single-phase immersion cooling system of FIG. 8 further comprises at least a propulsion-like apparatus 135 and a mount or stand 139. The at least a propulsion-like apparatus 135 is configured to supplement and enhance the at least a first flow channel for directing the first flow of the dielectric thermally conductive fluid contained within the fluid-tight containment vessel 190, 199 generated by the pump 130, together with the disposition of the first and second opening 119, 129. The at least a propulsion-like apparatus 135 is mounted to the mount or stand 139.

In certain embodiments, dielectric thermally conductive fluid (not shown) is contained within the fluid-tight containment vessel 190, 199 and the at least a heat-generating electronic device 150, 155 is submerged within the dielectric thermally conductive fluid. The heat exchanger system comprises the pump 130, the heat exchanger 170, the at least a first conduit 110, the at least a second conduit 120, the at least a propulsion-like apparatus 135 and a mount or stand 139. The heat exchanger 170 has a heat exchanger inlet and a heat exchanger outlet. The at least a first conduit 110 has a first modifiable portion 115 comprising a first opening 119 submerged within the dielectric thermally conductive fluid. The at least a second conduit 120 has a second modifiable portion 125 comprising a second opening 129 submerged within the dielectric thermally conductive fluid. The at least a propulsion-like apparatus 135 comprises at least a propeller, a motor, and a frame. The propeller is electrically connected to the motor. The propeller and motor are mounted to the frame. The at least a propulsion-like apparatus 135 is configured to convert rotational movement to thrust to move dielectric thermally conductive fluid from one face of the at least a propulsion-like apparatus 135 to an opposite face of the at least a propulsion-like apparatus 135. Thus, the at least a propulsion-like apparatus 135 supplements and enhances the at least a first flow channel for directing the first flow of the dielectric thermally conductive fluid contained within the fluid-tight containment vessel 190, 199 generated by the pump 130, together with the disposition of the first and second opening 119, 129. The mount or stand 139 is disposed next to the pump 130 and comprise at least two openings 138. The at least a second conduit 120 and the second opening 129 at least partially extends through at least one of the at least two openings 138 undisturbed.

In certain embodiments, at least one of the at least a first conduit 110 or second conduit 120 circulates dielectric thermally conductive fluid from the heat exchanger outlet into the dielectric thermally conductive fluid contained within the fluid-tight containment vessel 190, 199 and the other of the first conduit 110 or second conduit 120 circulates dielectric thermally conductive fluid contained within the fluid-tight containment vessel 190, 199 thereout to the heat exchanger inlet via the pump 130. The first and second opening 119, 129 are disposed near to greatest opposing ends of the dielectric thermally conductive fluid contained within the fluid-tight containment vessel 190, 199. The at least a propulsion-like apparatus 135 is positioned between the first and second opening 119, 129. The direction of thrust to move dielectric thermally conductive fluid from one face of the at least a propulsion-like apparatus 135 to an opposite face of the at least a propulsion-like apparatus 135 is dependent on which of at least one of the at least a first conduit 110 or second conduit 120 circulates dielectric thermally conductive fluid from the heat exchanger outlet into the dielectric thermally conductive fluid contained within the fluid-tight containment vessel 190, 199 and which one of the other of the first conduit 110 or second conduit 120 circulates dielectric thermally conductive fluid contained within the fluid-tight containment vessel 190, 199 thereout to the heat exchanger inlet via the pump 130. The general direction of the at least a first flow channel for directing the first flow of the dielectric thermally conductive fluid contained within the fluid-tight containment vessel 190, 199 generated by the pump 130, together with the disposition of the first and second opening 119, 129 circulating dielectric thermally conductive fluid contained within the fluid-tight containment vessel 190, 199 is the same as the direction of thrust moving liquid from one face of the at least a propulsion-like apparatus 135 to the opposite face of the at least a propulsion-like apparatus 135.

It is readily appreciated that any suitable type, style, size, and amount of the at least a propulsion-like apparatus 135 configured for underwater and immersible usage, for different capacities (flow rate), and of various non-rust materials, may be implemented by those of ordinary skill in the relevant art within the single-phase immersion cooling system 100 and the embodiments are not limited thereto. As long as dielectric thermally conductive fluid is circulated from an outlet of the heat exchanger radiator 170 into the dielectric thermally conductive fluid contained within the fluid-tight containment vessel 190, 199 through a conduit 110, 120, and dielectric thermally conductive fluid contained within the fluid-tight containment vessel 190, 199 is circulated thereout to an inlet of the heat exchanger radiator 170 through an other conduit 110, 120, via the pump 130, and is supplemented and enhanced by the at least a propulsion-like apparatus 135, efficiently cooling the heat-generating electric and/or electronic elements, devices and/or systems, submerged within the dielectric thermally conductive fluid.

Figure 9:
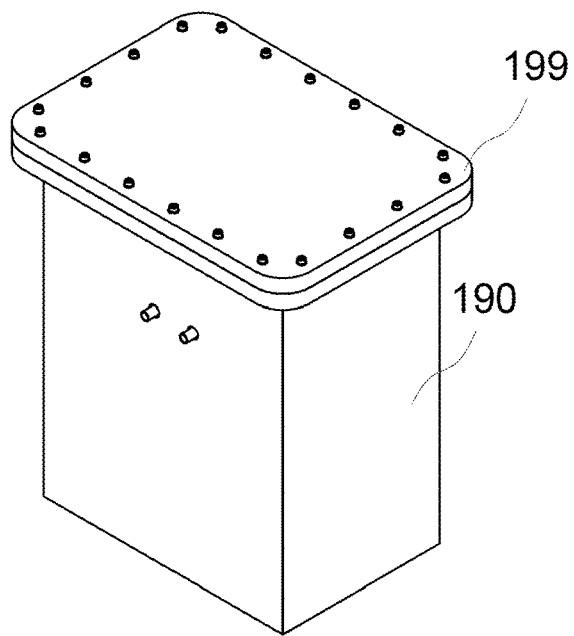
FIG. 9 depicts a representation of an embodiment of a single-phase immersion cooling system without a heat exchanger and at least a fan unit.

FIG. 9 depicts a representation of an embodiment of a single-phase immersion cooling system without a heat exchanger and at least a fan unit. Referring to FIG. 9, and referring to FIGS. 1A to 8, in some embodiments, the fluid-tight containment vessel 190, 199 comprises a containment vessel 190 having a vessel opening and a containment cover 199 configured to fluid-tight mount to the vessel opening. The dielectric thermally conductive fluid, at least a heat-generating electronic device 150, 155, and first and second opening 119, 129 are contained within the fluid-tight containment vessel 190, 199 via the vessel opening.

The fluid-tight containment vessel 190, 199 comprising the containment vessel 190 having the vessel opening and the containment cover 199 configured to fluid-tight mount to the vessel opening, easily and simply provide access to a user for filling of the dielectric thermally conductive fluid, decreasing total installation time.

The single-phase immersion cooling system 100 decreases risks for leakage as risks for a liquid-cooling system having a heat exchanger in thermal contact with the electric and/or electronic elements, devices and/or systems, transporting heat away therefrom are greater, due to leakage along any one of conduits, mounting portions, and heat exchangers of the liquid-cooling system causing damage to the non-submersible electric and/or electronic elements, devices and/or systems. The fluid-tight containment vessel 190, 199 also prevents contact of the heat-generating electric and/or electronic elements, devices and/or systems during operation with the surrounding environment, decreasing damage due to high temperature, high humidity, oily or dusty air, and/or salty coastal area environments.

In some embodiments, the single-phase immersion cooling system 100 further comprises at least a fluid-tight first conduit access entrance and at least a fluid-tight second conduit access entrance. The at least a fluid-tight first conduit access entrance is through the fluid-tight containment vessel 190, 199 and is configured to provide at least the first conduit 110 from an exterior of the fluid-tight containment vessel 190, 199 to an interior of the fluid-tight containment vessel 190, 199 for access to the dielectric thermally conductive fluid contained within the fluid-tight containment vessel 190, 199. The at least a fluid-tight second conduit access entrance is through the fluid-tight containment vessel 190, 199 and configured to provide at least the second conduit 120 from an exterior of the fluid-tight containment vessel 190, 199 to an interior of the fluid-tight containment vessel 190, 199 for access to the dielectric thermally conductive fluid contained within the fluid-tight containment vessel 190, 199.

In some embodiments, the at least a heat-generating electronic device 150, 155 comprises at least one of a motherboard, printed circuit board, central processing unit (CPU), CPU chipset, graphics processing units (GPU), physics processing unit (PPU), memory, storage device, or lighting, or any combination of the foregoing, mounted on a motherboard and/or expansion card, or the like. Examples of motherboards comprise MicroATX, full size ATX and/or larger motherboards etc. Examples of storage devices and components comprise solid state drives, non-volatile memory express, and, hard disk drives etc.

In some embodiments, the single-phase immersion cooling system 100 further comprises at least a fluid-tight cable access entrance (not shown) through the fluid-tight containment vessel 190, 199. The at least a fluid-tight cable access entrance is configured to provide at least one of a control cable, data cable, communications cable, or signal cable, or any combination of the foregoing, from an exterior of the fluid-tight containment vessel 190, 199 to an interior of the fluid-tight containment vessel 190, 199 for further access to the at least a heat-generating electronic device 150, 155.

In some embodiments, the single-phase immersion cooling system 100 further comprises a power supply unit 140 submerged within the dielectric thermally conductive fluid. The power supply unit 140 is configured to provide power to the at least a heat-generating electronic device 150, 155, wherein the at least a fluid-tight cable access entrance through the fluid-tight containment vessel 190, 199 is further configured to provide at least a power cable 143 from an exterior of the fluid-tight containment vessel 190, 199 to an interior of the fluid-tight containment vessel 190, 199 for further access to the power supply unit 140.

The fluid-tight cable and conduit access entrances provides easy and simple mounting and access to a user for control cables, data cables, communications cables, signal cables, and/or power cables, from the exterior of the fluid-tight containment vessel 190, 199 to the interior of the fluid-tight containment vessel 190, 199 for access to the at least a heat-generating electronic device 150, 155 and/or power supply unit 140, respectively. As an example, audio ports, ethernet ports, display ports, VGA ports, digital visual interface (DVI) and/or high-definition multimedia interfaces (HDMIs) may be mounted to an outside of the fluid-tight containment vessel 190, 199 and connected by cables 153, 157, from the exterior of the fluid-tight containment vessel 190, 199 to the interior of the fluid-tight containment vessel 190, 199 for access to the at least a heat-generating electronic device 150, 155.

It is readily appreciated that any suitable type, style, size, material and amount of fluid-tight attachment means may be implemented by those of ordinary skill in the relevant art within the single-phase immersion cooling system 100 and the embodiments are not limited thereto. Examples of fluid-tight attachment means comprise gluing, welding, or gasketing, or any combination of the foregoing etc. As long as the first and second opening 119, 129 generate at least a steady flow channel for directing a steady flow of the dielectric thermally conductive fluid contained within the fluid-tight containment vessel 190, 199.

In some embodiments, the single-phase immersion cooling system 100 further comprises a removable bracket structure 160 disposed and mounted within the fluid-tight containment vessel 190, 199, configured for mounting of the power supply unit 140 and the at least a heat-generating electronic device 150, 155 thereto.

The removable bracket structure 160 disposed and mounted within the fluid-tight containment vessel 190, 199, configured for mounting of the heat-generating electric and/or electronic elements, devices and/or systems thereto, easily and simply provide access to a user for mounting of the heat-generating electric and/or electronic elements, devices and/or systems, decreasing total installation time.

Figure 10:
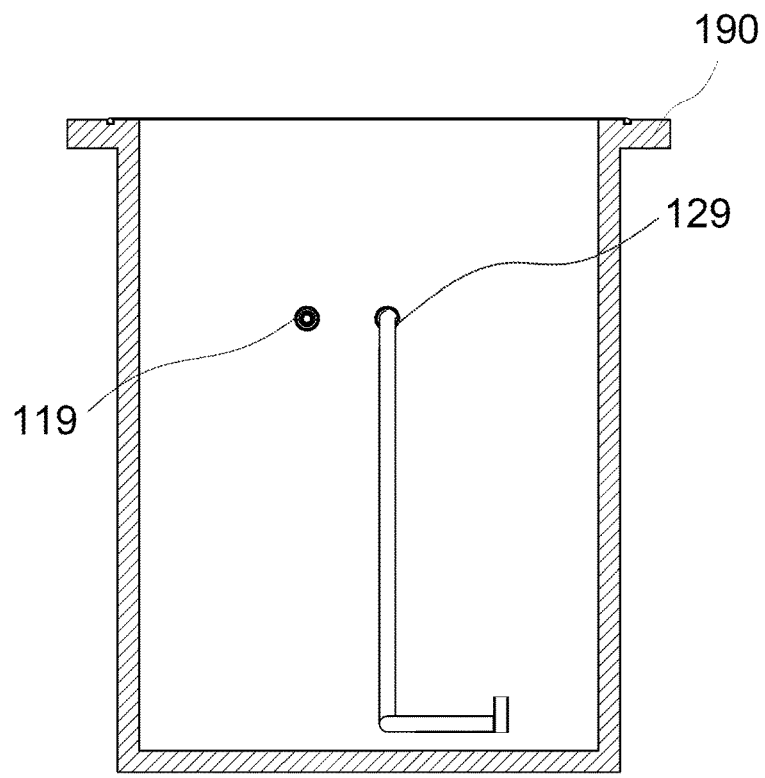
FIG. 10 depicts a cross-sectional view of an embodiment of the conduits of a single-phase immersion cooling system.

FIG. 10 depicts a cross-sectional view of an embodiment of the conduits of a single-phase immersion cooling system. Referring to FIG. 10, and referring to FIGS. 1A to 9, in certain embodiments, the single-phase immersion cooling system further comprises at least a first conduit 210 having a third modifiable portion 213, 215 and at least a second conduit 220 having a fourth modifiable portion 225.

Figure 11:
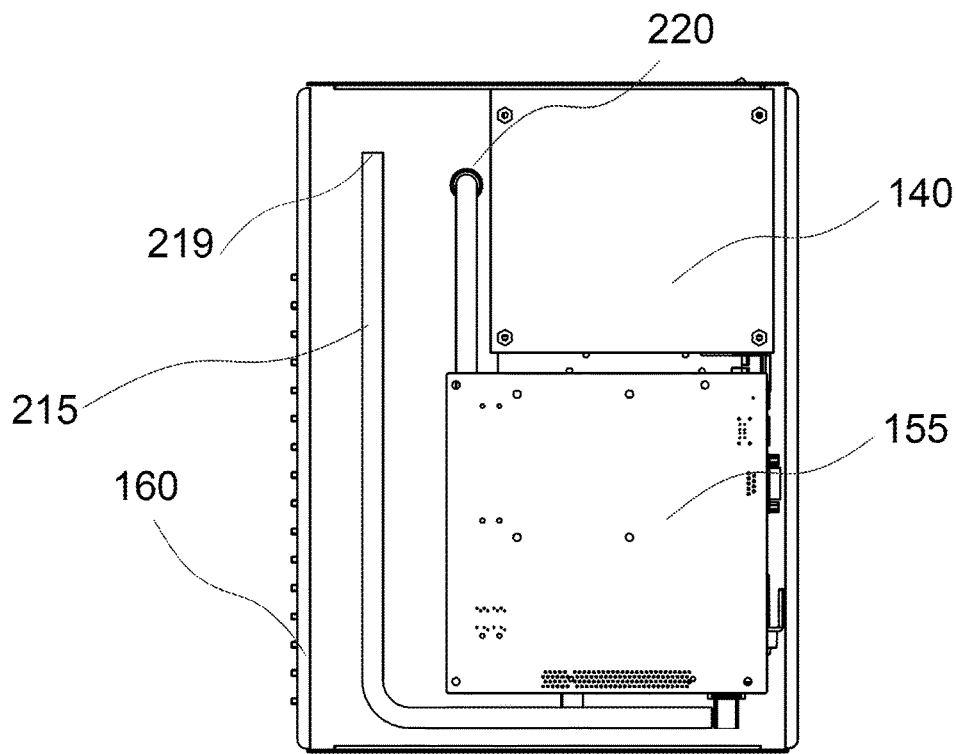
FIG. 11 depicts a cross-sectional view of an alternative embodiment of a single-phase immersion cooling system.
Figure 12:
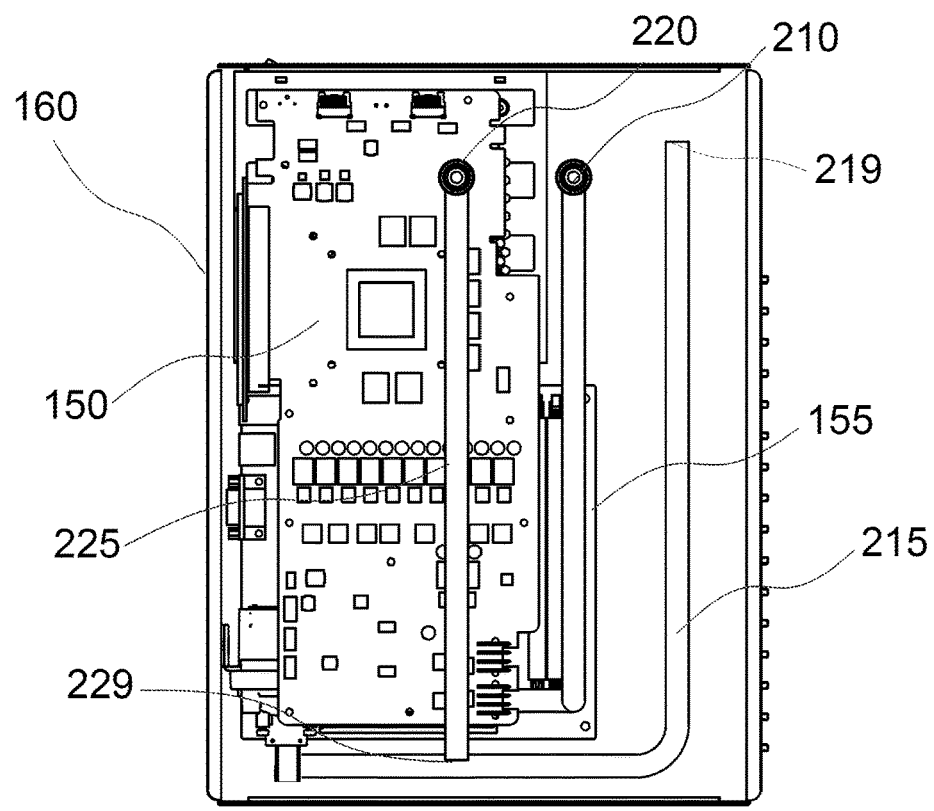
FIG. 12 depicts a cross-sectional view of the alternative embodiment of FIG. 11 from an opposing side.
Figure 13:
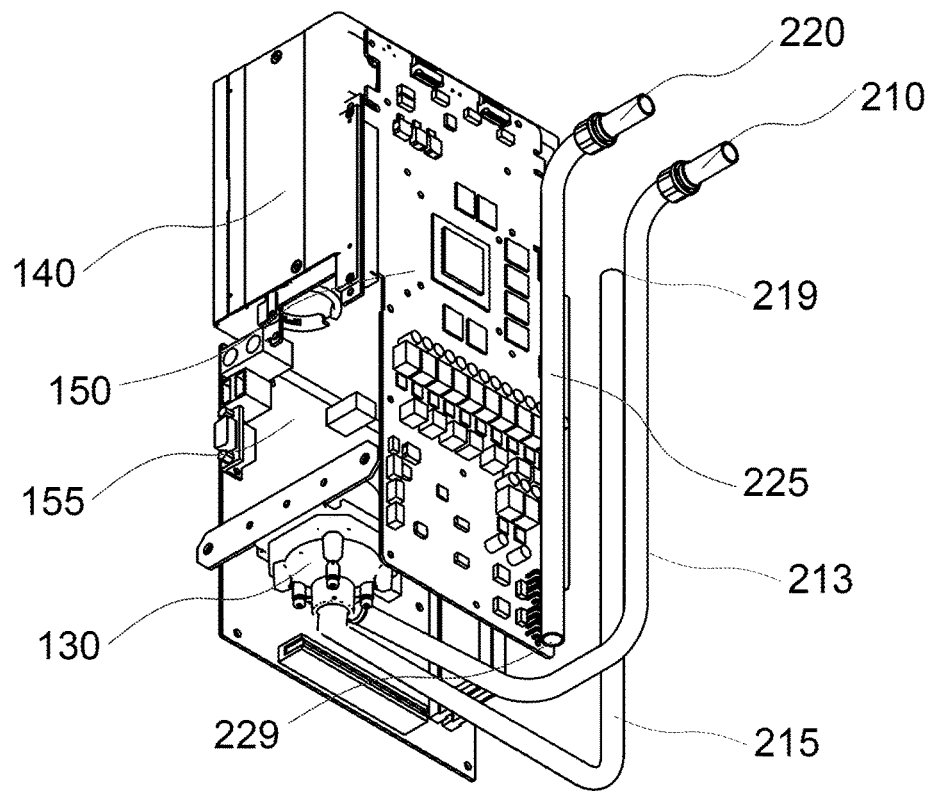
FIG. 13 depicts a representation of an alternative embodiment of conduits, a pump, a power supply unit, a motherboard and a printed circuit board.
Figure 14:
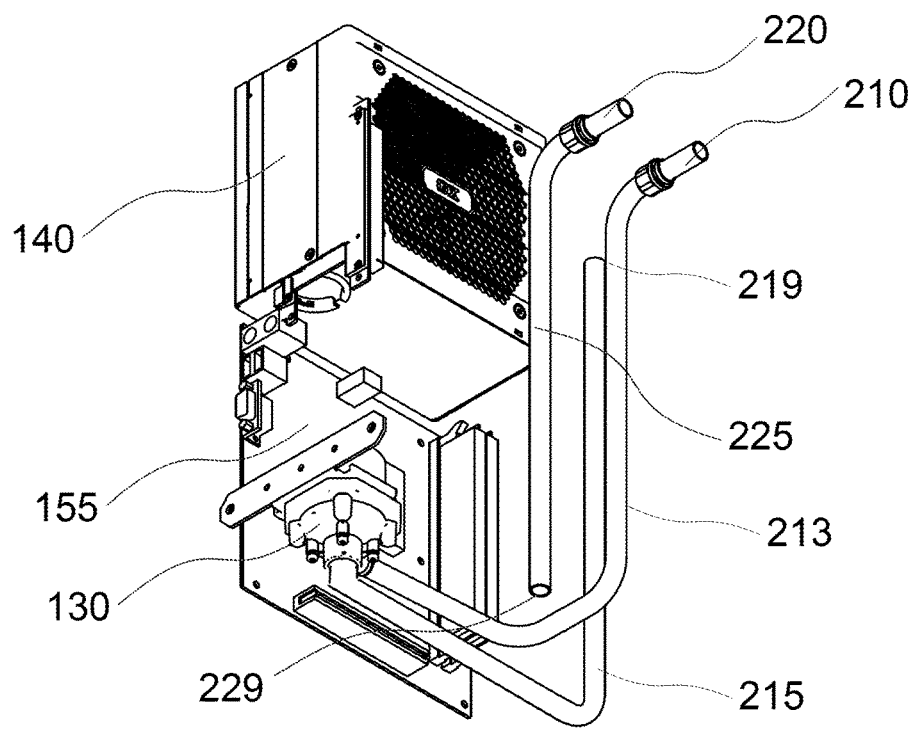
FIG. 14 depicts a representation of an alternative embodiment of conduits, a pump, a power supply unit and a printed circuit board.
Figure 15:
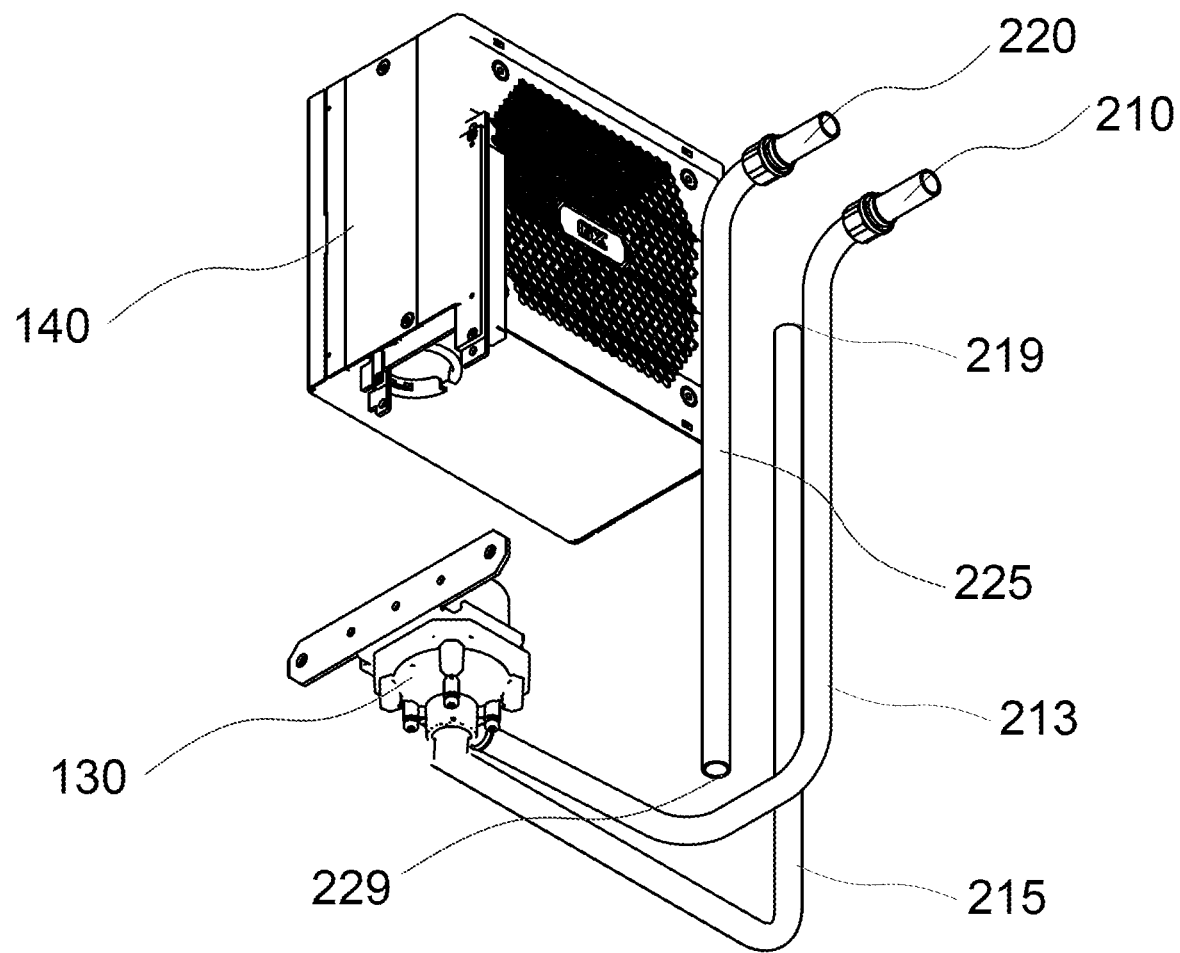
FIG. 15 depicts a representation of an alternative embodiment of conduits, a pump, and a power supply unit.

FIG. 11 depicts a cross-sectional view of an alternative embodiment of a single-phase immersion cooling system. FIG. 12 depicts a cross-sectional view of the alternative embodiment of FIG. 11 from an opposing side. FIG. 13 depicts a representation of an alternative embodiment of conduits, a pump, a power supply unit, a motherboard and a printed circuit board. FIG. 14 depicts a representation of an alternative embodiment of conduits, a pump, a power supply unit and a printed circuit board. FIG. 15 depicts a representation of an alternative embodiment of conduits, a pump, and a power supply unit. Referring to FIGS. 10 to 15, and referring to FIGS. 1A and 1B, FIGS. 7A and 7B, FIG. 8, and FIG. 9, the third modifiable portion 213, 215 comprises a third opening 219 submerged within the dielectric thermally conductive fluid and the fourth modifiable portion 225 comprises a fourth opening 229 submerged within the dielectric thermally conductive fluid. The first modifiable portion 115 is dismounted from the at least a first conduit 210 and the third modifiable portion 213, 215 is mounted to the at least a first conduit 210 and the second modifiable portion 125 is dismounted from the at least a second conduit 220 and the fourth modifiable portion 225 is mounted to the at least a second conduit 220. At least one of the first conduit 210 or second conduit 220 circulates dielectric thermally conductive fluid from the heat exchanger outlet into the dielectric thermally conductive fluid contained within the fluid-tight containment vessel 190, 199 and the other of the first conduit 210 or second conduit 220 circulates dielectric thermally conductive fluid contained within the fluid-tight containment vessel 190, 199 thereout to the heat exchanger inlet via the pump 130. The third and fourth openings 219, 229 are disposed near to greatest opposing ends of the dielectric thermally conductive fluid contained within the fluid-tight containment vessel 190, 199 which are different from that of the disposition of the first and second openings 119, 129. The lengths and shapes of the first and third modifiable portions 115, 213, 215 and lengths and shapes of the second and fourth modifiable portions 125, 225 are different, respectively, and the disposition of the third and fourth openings 219, 229 generate at least a third flow channel, different from the first flow channel, for directing a third flow of the dielectric thermally conductive fluid contained within the fluid-tight containment vessel 190, 199. In certain embodiments, the third modifiable portion 213 is nearer to the fourth modifiable portion 225 than the third modifiable portion 215, whereby the third opening 219 is nearer to an inner side of the removable bracket structure 160 than the fourth opening 229.

In certain embodiments, the pump 130 of the single-phase immersion cooling system, together with the disposition of the third and fourth opening 219, 229, generate at least a third flow channel for directing a third flow of the dielectric thermally conductive fluid contained within the fluid-tight containment vessel 190, 199, however, the embodiments are not limited thereto. Those having ordinary skill in the relevant art may readily appreciate that the pump 130 of the single-phase immersion cooling system 100, together with the disposition of a fifth opening 291A and fourth opening 229 may generate at least a fifth flow channel for directing a f516225ifth flow of the dielectric thermally conductive fluid contained within the fluid-tight containment vessel 190, 199. Those having ordinary skill in the relevant art may also readily appreciate that apparatuses and devices that supplement and enhance the at least a fifth flow channel for directing the fifth flow of the dielectric thermally conductive fluid contained within the fluid-tight containment vessel 190, 199, may also be implemented in the embodiments.

Figure 16:
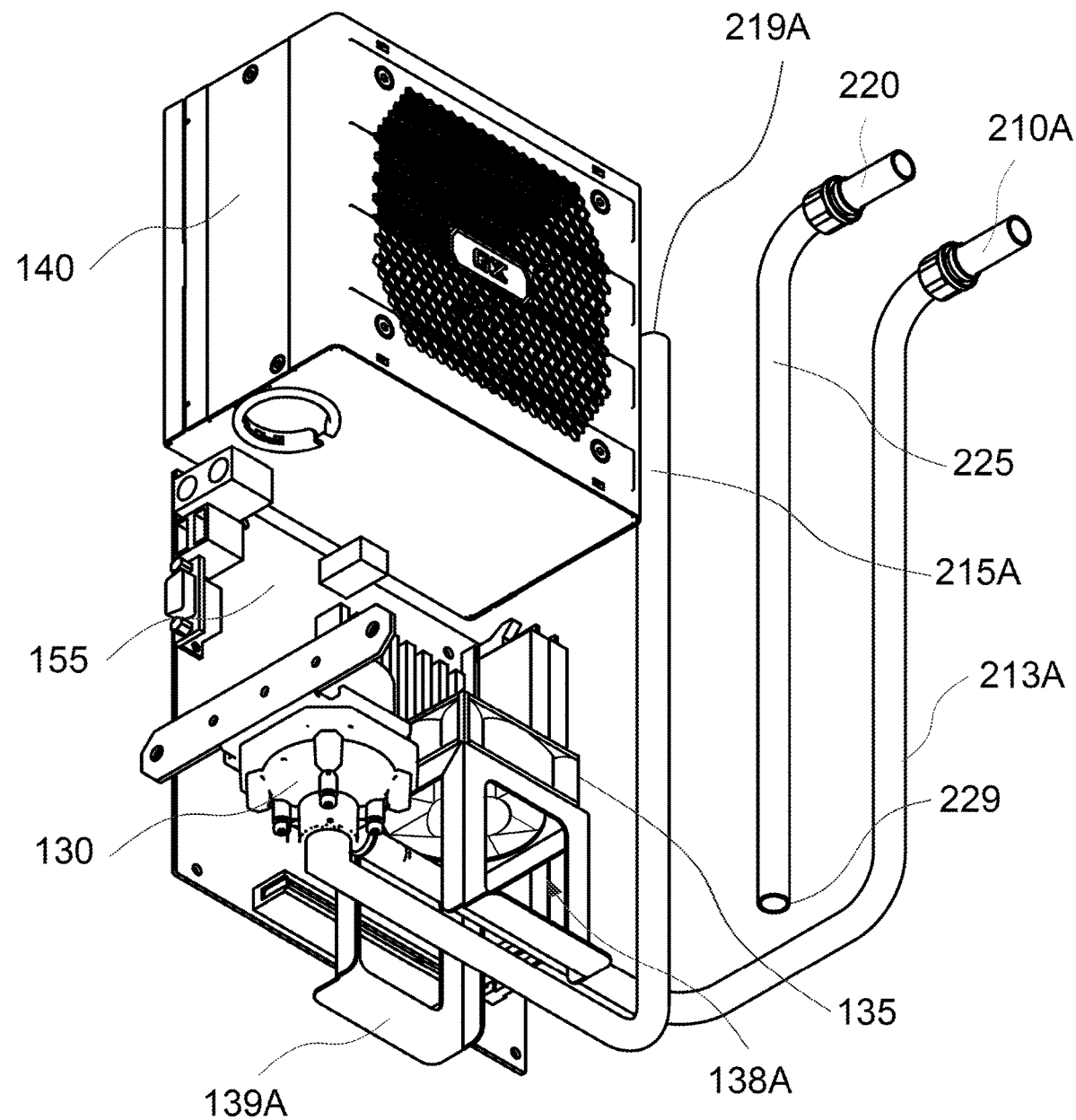
FIG. 16 depicts a representation of another embodiment of conduits, a pump, a power supply unit, a printed circuit board and a propulsion-like apparatus.

FIG. 16 depicts a representation of an embodiment of conduits, a pump, a power supply unit, a printed circuit board and a propulsion-like apparatus. Referring to FIG. 16, and referring to FIGS. 1A-2B, 7A-9, and 10-15, the single-phase immersion cooling systems of FIGS. 1A-2B, 7A-9, and 10-15 may be similar in some respects to the single-phase immersion cooling system of FIG. 16, and thus may be best understood with reference thereto where like numerals designate like components not described again in detail. Unlike the single-phase immersion cooling systems of FIGS. 1A-2B, 7A-7B, 9, and 10-15 and similar in some respects to the single-phase immersion cooling systems of FIG. 8, the single-phase immersion cooling system of FIG. 16 further comprises at least a fifth conduit 210A having a fifth modifiable portion 213A, 215A and at least a second conduit 220 having a fourth modifiable portion 225 and at least a propulsion-like apparatus 135 and a mount or stand 139A. The fifth modifiable portion 213A, 215A comprises a fifth opening 219A submerged within the dielectric thermally conductive fluid and the fourth modifiable portion 225 comprises a fourth opening 229 submerged within the dielectric thermally conductive fluid. The first modifiable portion 115 is dismounted from the at least a first conduit 210 and the fifth modifiable portion 213A, 215A is mounted to the at least a first conduit 210 and the second modifiable portion 125 is dismounted from the at least a second conduit 220 and the fourth modifiable portion 225 is mounted to the at least a second conduit 220. At least one of the first conduit 210 or second conduit 220 circulates dielectric thermally conductive fluid from the heat exchanger outlet into the dielectric thermally conductive fluid contained within the fluid-tight containment vessel 190, 199 and the other of the first conduit 210 or second conduit 220 circulates dielectric thermally conductive fluid contained within the fluid-tight containment vessel 190, 199 thereout to the heat exchanger inlet via the pump 130. The fifth and fourth openings 219A, 229 are disposed near to greatest opposing ends of the dielectric thermally conductive fluid contained within the fluid-tight containment vessel 190, 199 which are different from that of the disposition of the first and second openings 119, 129 and third opening 219. The lengths and shapes of the first, third and fifth modifiable portions 115, 213, 215, 213A, 215A and lengths and shapes of the second and fourth modifiable portions 125, 225 are different, respectively, and the disposition of the fifth and fourth openings 219A, 229 generate at least a fifth flow channel, different from the first flow channel and third flow channel, for directing a fifth flow of the dielectric thermally conductive fluid contained within the fluid-tight containment vessel 190, 199. In certain embodiments, the fifth modifiable portion 213A is nearer to an inner side of the removable bracket structure 160 than the fifth modifiable portion 215A, whereby the fifth opening 219A is nearer to the power supply unit 140 than the fourth opening 229. The at least a propulsion-like apparatus 135 is configured to supplement and enhance the at least a fifth flow channel for directing the fifth flow of the dielectric thermally conductive fluid contained within the fluid-tight containment vessel 190, 199 generated by the pump 130, together with the disposition of the first and second opening 119, 129. The at least a propulsion-like apparatus 135 is mounted to the mount or stand 139.

In certain embodiments, dielectric thermally conductive fluid (not shown) is contained within the fluid-tight containment vessel 190, 199 and the at least a heat-generating electronic device 150, 155 is submerged within the dielectric thermally conductive fluid. The heat exchanger system comprises the pump 130, the heat exchanger 170, the at least a first conduit 110, the at least a second conduit 120, the at least a propulsion-like apparatus 135 and a mount or stand 139A. The heat exchanger 170 has a heat exchanger inlet and a heat exchanger outlet. The at least a fifth conduit 210A has a fifth modifiable portion 213A, 215A comprising a fifth opening 219A submerged within the dielectric thermally conductive fluid. The at least a fourth conduit 220 has a fourth modifiable portion 225 comprising a fourth opening 229 submerged within the dielectric thermally conductive fluid. The at least a propulsion-like apparatus 135 comprises at least a propeller, a motor, and a frame. The propeller is electrically connected to the motor. The propeller and motor are mounted to the frame. The at least a propulsion-like apparatus 135 is configured to convert rotational movement to thrust to move dielectric thermally conductive fluid from one face of the at least a propulsion-like apparatus 135 to an opposite face of the at least a propulsion-like apparatus 135. Thus, the at least a propulsion-like apparatus 135 supplements and enhances the at least a fifth flow channel for directing the first flow of the dielectric thermally conductive fluid contained within the fluid-tight containment vessel 190, 199 generated by the pump 130, together with the disposition of the fifth and fourth opening 219A, 229. The mount or stand 139A is disposed next to the pump 130 and comprise at least two openings 138. The at least a fifth modifiable portion 213A, 215A at least partially extends between the at least two openings 138A undisturbed.

In certain embodiments, at least one of the at least a first conduit 210A or second conduit 220 circulates dielectric thermally conductive fluid from the heat exchanger outlet into the dielectric thermally conductive fluid contained within the fluid-tight containment vessel 190, 199 and the other of the first conduit 210A or second conduit 220 circulates dielectric thermally conductive fluid contained within the fluid-tight containment vessel 190, 199 thereout to the heat exchanger inlet via the pump 130. The fifth and fourth opening 219A, 229 are disposed near to greatest opposing ends of the dielectric thermally conductive fluid contained within the fluid-tight containment vessel 190, 199. The at least a propulsion-like apparatus 135 is positioned between the fifth and fourth opening 219A, 229. The direction of thrust to move dielectric thermally conductive fluid from one face of the at least a propulsion-like apparatus 135 to an opposite face of the at least a propulsion-like apparatus 135 is dependent on which of at least one of the at least a first conduit 210A or second conduit 220 circulates dielectric thermally conductive fluid from the heat exchanger outlet into the dielectric thermally conductive fluid contained within the fluid-tight containment vessel 190, 199 and which one of the other of the first conduit 210A or second conduit 220 circulates dielectric thermally conductive fluid contained within the fluid-tight containment vessel 190, 199 thereout to the heat exchanger inlet via the pump 130. The general direction of the at least a fifth flow channel for directing the fifth flow of the dielectric thermally conductive fluid contained within the fluid-tight containment vessel 190, 199 generated by the pump 130, together with the disposition of the fifth and fourth opening 219A, 229 circulating dielectric thermally conductive fluid contained within the fluid-tight containment vessel 190, 199 is the same as the direction of thrust moving liquid from one face of the at least a propulsion-like apparatus 135 to the opposite face of the at least a propulsion-like apparatus 135.

It is readily appreciated that any suitable type, style, size, and amount of the at least a propulsion-like apparatus 135 configured for underwater and immersible usage, for different capacities (flow rate), and of various non-rust materials, may be implemented by those of ordinary skill in the relevant art within the single-phase immersion cooling system and the embodiments are not limited thereto. As long as dielectric thermally conductive fluid is circulated from an outlet of the heat exchanger radiator 170 into the dielectric thermally conductive fluid contained within the fluid-tight containment vessel 190, 199 through a conduit 210A, 220, and dielectric thermally conductive fluid contained within the fluid-tight containment vessel 190, 199 is circulated thereout to an inlet of the heat exchanger radiator 170 through an other conduit 210A, 220, via the pump 130, and is supplemented and enhanced by the at least a propulsion-like apparatus 135, efficiently cooling the heat-generating electric and/or electronic elements, devices and/or systems, submerged within the dielectric thermally conductive fluid.

In certain embodiments, the pump 130 of the single-phase immersion cooling system 100 is submerged within the dielectric thermally conductive fluid within the fluid-tight containment vessel 190, 199. In certain embodiments, the pump 130 of the single-phase immersion cooling system 100 is mounted to an outer side of the fluid-tight containment vessel 190, 199 (not shown).

In certain embodiments, the heat exchanger 170 of the single-phase immersion cooling system comprises a heat exchanger radiator 170, mounted to an outer side of the fluid-tight containment vessel 190, 199. In certain embodiments, the heat exchanger 170 of the single-phase immersion cooling system 100 further comprises at least a fan unit 180 mounted to the heat exchanger radiator 170, opposite to the outer side of the fluid-tight containment vessel 190, 199. In certain embodiments, the heat exchanger radiator 170 of the single-phase immersion cooling system 100 comprises at least a built-in fluid tank reservoir to sides thereof (not shown) having reservoir openings (not shown), whereby dielectric thermally conductive fluid is added into the built-in fluid tank reservoir. A volume of the dielectric thermally conductive fluid may be retained in the fluid tank during operation of the single-phase immersion cooling system 100. In some embodiments, a visible portion of the dielectric thermally conductive fluid in the fluid tank via a transparent material may allow users to visually observe an amount of the dielectric thermally conductive fluid in the cooling loop, and determine when additional dielectric thermally conductive fluid may need to be added (not shown). Via the fluid tank, the dielectric thermally conductive fluid loss over time due to permeation may be mitigated, and air bubbles may gradually be replaced during fluid circulation, increasing cooling loop efficiency of the single-phase immersion cooling system.

In certain embodiments, the pump 130 of the single-phase immersion cooling system 100 is submerged within the dielectric thermally conductive fluid within the fluid-tight containment vessel 190, 199. In certain embodiments, the pump 130 of the single-phase immersion cooling system 100 is mounted to an outer side of the fluid-tight containment vessel 190, 199 (not shown).

In certain embodiments, the heat exchanger 170 of the single-phase immersion cooling system 100 comprises a heat exchanger radiator 170, mounted to an outer side of the fluid-tight containment vessel 190, 199. In certain embodiments, the heat exchanger 170 of the single-phase immersion cooling system 100 further comprises at least a fan unit 180 mounted to the heat exchanger radiator 170, opposite to the outer side of the fluid-tight containment vessel 190, 199. In certain embodiments, the heat exchanger radiator 170 of the single-phase immersion cooling system 100 comprises at least a built-in fluid tank reservoir to sides thereof (not shown) having reservoir openings (not shown), whereby dielectric thermally conductive fluid is added into the built-in fluid tank reservoir. A volume of the dielectric thermally conductive fluid may be retained in the fluid tank during operation of the single-phase immersion cooling system 100. In some embodiments, a visible portion of the dielectric thermally conductive fluid in the fluid tank via a transparent material may allow users to visually observe an amount of the dielectric thermally conductive fluid in the cooling loop, and determine when additional dielectric thermally conductive fluid may need to be added (not shown). Via the fluid tank, the dielectric thermally conductive fluid loss over time due to permeation may be mitigated, and air bubbles may gradually be replaced during fluid circulation, increasing cooling loop efficiency of the single-phase immersion cooling system 100.

It is readily appreciated that any suitable type, style, and size of the heat exchanger radiator 170 may be implemented by those of ordinary skill in the relevant art within the single-phase immersion cooling system 100 and the embodiments are not limited thereto. As long as dielectric thermally conductive fluid is circulated from an outlet of the heat exchanger radiator 170 into the dielectric thermally conductive fluid contained within the fluid-tight containment vessel 190, 199 through a conduit, and dielectric thermally conductive fluid contained within the fluid-tight containment vessel 190, 199 is circulated thereout to an inlet of the heat exchanger radiator 170 through an other conduit, via the pump 130, efficiently cooling the heat-generating electric and/or electronic elements, devices and/or systems submerged within the dielectric thermally conductive fluid.

The at least a fan unit 180 may be coupled to the back end of the heat exchanger radiator 170 via a fastener (e.g., bolts, screws, an adhesive material, etc.) at structural portions of the heat exchanger radiator 170, transporting air through the heat exchanger radiator 170 to an air plenum or to an exterior of the fluid-tight containment vessel 190, 199. Those of ordinary skill in the relevant art may readily appreciate that the type and size of fans may be varied, as long as dielectric thermally conductive fluid may be circulated through the heat exchanger radiator 170 and air may be transferred through the heat exchanger radiator 170 to an air plenum or to an exterior of the fluid-tight containment vessel 190, 199.

The at least a fan unit 180 may be high pressure (e.g., a high airflow) fans. The at least a fan unit 180 may have reinforced fan blades. The design of the fan blades and/or other components (e.g., bearings, etc.) may be such that noise generated during operation may be minimized. The at least a fan unit 180 may be constructed using fasteners (e.g., anti-vibration rivets, gaskets, etc.) that may be used to minimized vibration during operation.

Figure 17:
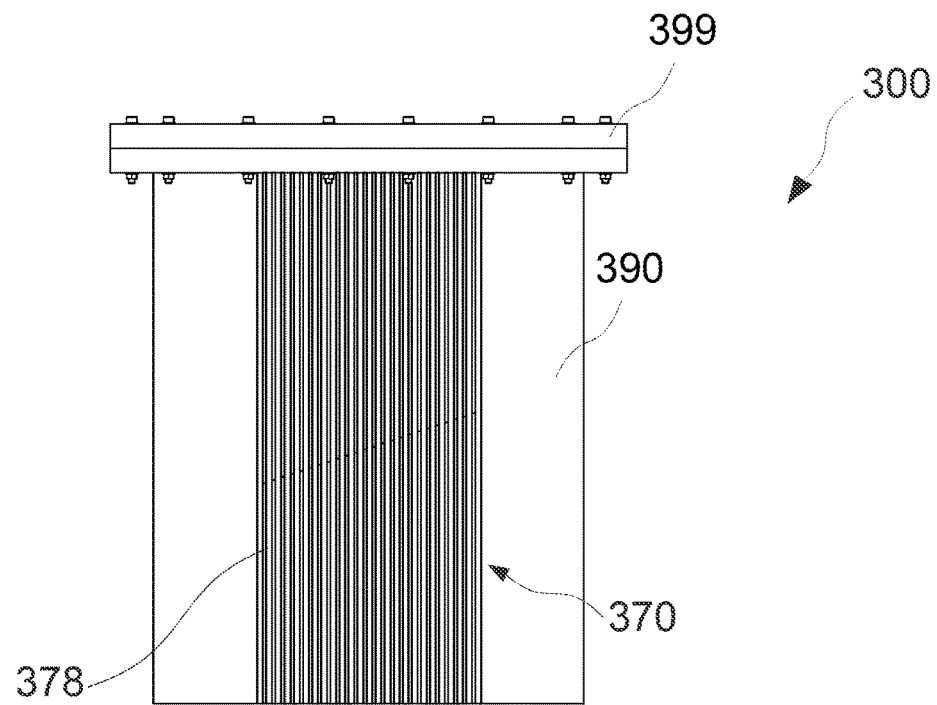
FIG. 17 depicts a representation of another alternative embodiment of a single-phase immersion cooling system.

FIG. 17 depicts a representation of another alternative embodiment of a single-phase immersion cooling system. Referring to FIG. 17, and referring to FIGS. 4-7B, 8, 13-15, and 16 the single-phase immersion cooling system of FIGS. 4-7B, 8, 13-15, and 16 may be similar in some respects to the single-phase immersion cooling system 300 of FIG. 17, and thus may be best understood with reference thereto where like numerals designate like components not described again in detail. Unlike the single-phase immersion cooling system of Figs. FIGS. 4-7B, 8, 13-15, and 16, the single-phase immersion cooling system 300 of FIG. 17 comprises a fin chambered heat exchanger 370. The fin chambered heat exchanger 370 may be mounted to the outer side of the fluid-tight containment vessel 390, 399, or integrated with a paneling thereof. The fin chambered heat exchanger 370, comprises a fluid chamber 372 and plurality of heatsink fins 378. The fluid chamber 372 has a first outlet 319 and a second outlet 329, whereby the at least a first conduit 110, 210, 210A having the first, third, and fifth modifiable portions 115, 213, 215, 213A, 215A comprising a first, third, and fifth opening 119, 219, 219A submerged within the dielectric thermally conductive fluid and the at least a second conduit 120, 220 having the second, and fourth modifiable portions 125, 225 comprising a second, and fourth opening 129, 229 submerged within the dielectric thermally conductive fluid may be fluid-tight mounted thereto. The dielectric thermally conductive fluid is circulated from either one of the first outlet 319 or second outlet 329 into the dielectric thermally conductive fluid contained within the fluid-tight containment vessel 390, 399 through either one of the at least a first conduit 110, 210, 210A or second conduit 120, 220. The dielectric thermally conductive fluid contained within the fluid-tight containment vessel 390, 399 is circulated thereout to the other one of the first outlet 319 or second outlet 329 through the other one of the at least a first conduit 110, 210, 210A or second conduit 120, 220, via the pump 130, efficiently cooling the heat-generating electric and/or electronic elements, devices and/or systems, submerged within the dielectric thermally conductive fluid.

In certain embodiments, the fluid chamber 372 comprises an outer casing and an inner casing; the inner casing is in direct contact with the dielectric thermally conductive fluid circulating within the single-phase immersion cooling system 300 and the outer casing is corresponding to, fluid-tight mounted to and opposite the inner casing. The outer and inner casings form a chamber therewithin, configured to generate a chamber flow thereabout. The chamber flow circulates the dielectric thermally conductive fluid throughout the chamber via flowing and/or braided channels. As an example, the fluid chamber 372 may comprise at least three flowing channels, connected by two turning points; however, the embodiments are not limited thereto. Those having ordinary skill in the relevant art may readily appreciate that the fluid chamber 372 may comprise more than three flowing channels, connected by more than two turning points, in various flowing shapes, in combination with, braided channels defined by island-like structures, or any number of braided channels defined by island-like structures throughout the fluid chamber 372. As long as the chamber flow circulates the dielectric thermally conductive fluid throughout the chamber.

In certain embodiments, upper most outer portions of the plurality of heatsink fins 378 do not exceed a plane of the paneling of the outer side of the fluid-tight containment vessel 390, 399; however, the embodiments are not limited thereto. Those of ordinary skill in the relevant art may readily appreciate that the plurality of heatsink fins 378 may exceed the plane of the paneling of the outer side of the fluid-tight containment vessel 390, 399.

Figure 18A:
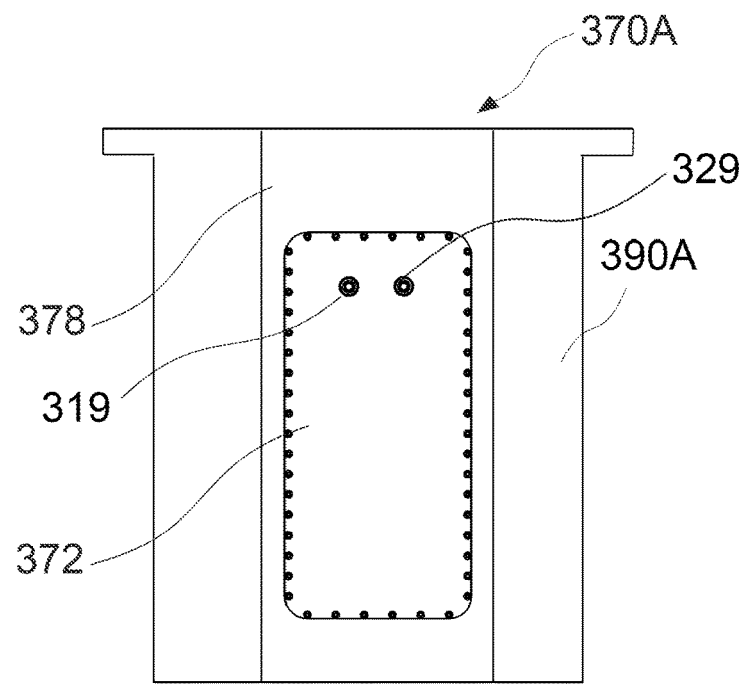
FIG. 18A depicts a representation of an inner panel of the another alternative embodiment of a single-phase immersion cooling system of FIG. 17.
Figure 18B:
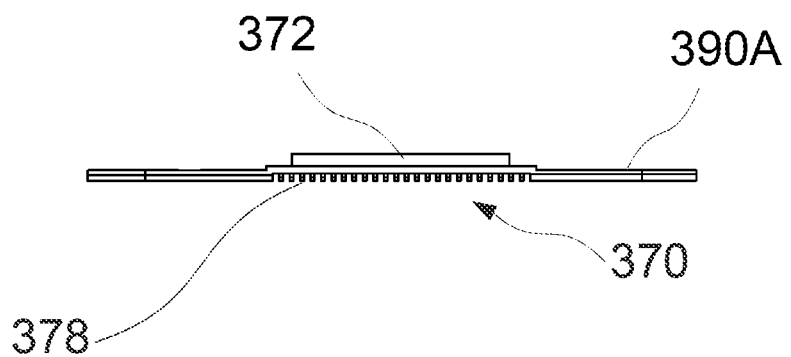
FIG. 18B depicts a plane view of the inner panel of the another alternative embodiment of a single-phase immersion cooling system FIG. 18A.

In certain embodiments, the plurality of heatsink fins 378 is in indirect contact with the dielectric thermally conductive fluid flowing through the flowing and/or braided channels; however, the embodiments are not limited thereto. FIG. 18A depicts a representation of an inner panel of the another alternative embodiment of a single-phase immersion cooling system of FIG. 17. FIG. 18B depicts a plane view of the inner panel of the another alternative embodiment of a single-phase immersion cooling system FIG. 18A. In certain embodiments, at least one of the plurality of heatsink fins 378 may be in direct contact with the dielectric thermally conductive fluid flowing through the flowing and/or braided channels via a fin input, fin channel, and fin output thereof. The fin input and output is in direct communication with the dielectric thermally conductive fluid flowing through the flowing and/or braided channels and the fin channel is in direct communication with the fin input and output.

It is readily appreciated that any suitable type, style, size, and amount of the fin chambered heat exchanger 370 may be implemented by those of ordinary skill in the relevant art within the single-phase immersion cooling system 300 and the embodiments are not limited thereto. As long as dielectric thermally conductive fluid is circulated thereout into the dielectric thermally conductive fluid contained within the fluid-tight containment vessel 390, 399 through a conduit, and dielectric thermally conductive fluid contained within the fluid-tight containment vessel 390, 399 is circulated therein through an other conduit, via the pump 130, efficiently cooling the heat-generating electric and/or electronic elements, devices and/or systems submerged within the dielectric thermally conductive fluid.

In some embodiments, the dielectric thermally conductive fluid of the single-phase immersion cooling system 100 comprises a single-phase fluid. Examples of dielectric thermally conductive fluid comprise hydrocarbons such as mineral oils, synthetic oils, and natural oils, and/or engineered dielectric thermally conductive fluids etc.

In some embodiments, the fluid-tight containment vessel 190, 199 of the single-phase immersion cooling system 100 comprises at least one of a metal, plastic, or transparent plastic material, or any combination of the foregoing. Examples of metal materials comprise magnesium and aluminium etc. and examples of plastic materials comprise ABS, PC, and Acrylic etc.

In an embodiment, a single-phase immersion cooling method, comprising providing a single-phase immersion cooling system 100 and circulating a dielectric thermally conductive fluid therewithin is provided. The single-phase immersion cooling method comprises providing the single-phase immersion cooling system 100 including providing a fluid-tight containment vessel 190, 199, providing a dielectric thermally conductive fluid contained within the fluid-tight containment vessel 190, 199, providing at least a heat-generating electronic device 150, 155 submerged within the dielectric thermally conductive fluid, and providing a heat exchanger system. The heat exchanger system of the method comprises a pump 130, a heat exchanger 170 having a heat exchanger inlet and a heat exchanger outlet, at least a first conduit 110 having a first modifiable portion 115 comprising a first opening 119 submerged within the dielectric thermally conductive fluid, and at least a second conduit 120 having a second modifiable portion 125 comprising a second opening 129 submerged within the dielectric thermally conductive fluid. The method further comprises circulating, via the pump 130, dielectric thermally conductive fluid from the heat exchanger outlet into the dielectric thermally conductive fluid contained within the fluid-tight containment vessel 190, 199 through at least one of the first conduit 110 or second conduit 120 and circulating, via the pump 130, dielectric thermally conductive fluid contained within the fluid-tight containment vessel 190, 199 thereout to the heat exchanger inlet through the other of the first conduit 110 or second conduit 120. The first and second opening 119, 129 of the method are disposed near to greatest opposing ends of the dielectric thermally conductive fluid contained within the fluid-tight containment vessel 190, 199.

In certain embodiments of the method, the method further comprises generating at least a first flow channel for directing a first flow of the dielectric thermally conductive fluid contained within the fluid-tight containment vessel 190, 199 via the disposition of the first and second openings 119, 129.

In certain embodiments of the method, the heat exchanger system of the method comprises a pump 130, a heat exchanger 170 having a heat exchanger inlet and a heat exchanger outlet, at least a first conduit 110 having a first modifiable portion 115 comprising a first opening 119 submerged within the dielectric thermally conductive fluid, at least a second conduit 120 having a second modifiable portion 125 comprising a second opening 129 submerged within the dielectric thermally conductive fluid, at least a propulsion-like apparatus 135, and a mount or stand 139. The method further comprises circulating, via the pump 130 and supplemented and enhanced by the at least a propulsion-like apparatus 135, dielectric thermally conductive fluid from the heat exchanger outlet into the dielectric thermally conductive fluid contained within the fluid-tight containment vessel 190, 199 through at least one of the first conduit 110 or second conduit 120 and circulating, via the pump 130 and supplemented and enhanced by the at least a propulsion-like apparatus 135, dielectric thermally conductive fluid contained within the fluid-tight containment vessel 190, 199 thereout to the heat exchanger inlet through the other of the first conduit 110 or second conduit 120. The first and second opening 119, 129 of the method are disposed near to greatest opposing ends of the dielectric thermally conductive fluid contained within the fluid-tight containment vessel 190, 199.

Other features and principles of the method for circulating a dielectric thermally conductive fluid within a single-phase immersion cooling system 100 are generally the same as and described in detail in the embodiments of the single-phase immersion cooling system 100 above, and for sake of brevity, will not repeated hereafter.

In certain embodiments of the method, the method further comprises providing at least a first conduit 210 having a third modifiable portion 213, 215 comprising a third opening 219 submerged within the dielectric thermally conductive fluid and providing at least a second conduit 220 having a fourth modifiable portion 225 comprising a fourth opening 229 submerged within the dielectric thermally conductive fluid. The method further comprises dismounting the first modifiable portion 115 from the at least a first conduit 110 and mounting the third modifiable portion 213, 215 to the at least a first conduit 210 and dismounting the second modifiable portion 225 from the at least a second conduit 120 and mounting the fourth modifiable portion 225 to the at least a second conduit 220. Also, the method further comprises circulating, via the pump 130, dielectric thermally conductive fluid from the heat exchanger outlet into the dielectric thermally conductive fluid contained within the fluid-tight containment vessel 190, 199 through at least one of the first conduit 210 or second conduit 220 and circulating, via the pump 130, dielectric thermally conductive fluid contained within the fluid-tight containment vessel 190, 199 thereout to the heat exchanger inlet through the other of the first conduit 210 or second conduit 220. The single-phase immersion cooling method further comprises generating at least a third flow channel for directing a third flow of the dielectric thermally conductive fluid contained within the fluid-tight containment vessel 190, 199 via the disposition of the third and fourth openings 219, 229. The third and fourth openings 219, 229 of the single-phase immersion cooling method are disposed near to greatest opposing ends of the dielectric thermally conductive fluid contained within the fluid-tight containment vessel 190, 199 which are different from that of the disposition of the first and second openings 119, 129, whereby the lengths and shapes of the first and third modifiable portions 115, 213, 215 and lengths and shapes of the second and fourth modifiable portions 125, 225 are different, respectively.

Other features and principles of the method for circulating a dielectric thermally conductive fluid within a single-phase immersion cooling system 100 are generally the same as and described in detail in the embodiments of the single-phase immersion cooling system 100 above, and for sake of brevity, will not repeated hereafter.

In certain embodiments of the method, the heat exchanger system of the method comprises a pump 130, a heat exchanger 170 having a heat exchanger inlet and a heat exchanger outlet, at least a first conduit 210 having a fifth modifiable portion 213A, 215A comprising a fifth opening 219A submerged within the dielectric thermally conductive fluid, at least a second conduit 220 having a fourth modifiable portion 225 comprising a fourth opening 229 submerged within the dielectric thermally conductive fluid, at least a propulsion-like apparatus 135, and a mount or stand 139. The method further comprises dismounting the first modifiable portion 115 from the at least a first conduit 110 and mounting the fifth modifiable portion 213A, 215A to the at least a first conduit 210A and dismounting the second modifiable portion 225 from the at least a second conduit 120 and mounting the fourth modifiable portion 225 to the at least a second conduit 220. Also, the method further comprises circulating, via the pump 130 and supplemented and enhanced by the at least a propulsion-like apparatus 135, dielectric thermally conductive fluid from the heat exchanger outlet into the dielectric thermally conductive fluid contained within the fluid-tight containment vessel 190, 199 through at least one of the first conduit 210 or second conduit 220 and circulating, via the pump 130 and supplemented and enhanced by the at least a propulsion-like apparatus 135, dielectric thermally conductive fluid contained within the fluid-tight containment vessel 190, 199 thereout to the heat exchanger inlet through the other of the first conduit 210 or second conduit 220. The single-phase immersion cooling method further comprises generating at least a fifth flow channel for directing a fifth flow of the dielectric thermally conductive fluid contained within the fluid-tight containment vessel 190, 199 via the disposition of the fifth and fourth openings 219A, 229. The fifth and fourth openings 219A, 229 of the single-phase immersion cooling method are disposed near to greatest opposing ends of the dielectric thermally conductive fluid contained within the fluid-tight containment vessel 190, 199 which are different from that of the disposition of the first and second openings 119, 129, whereby the lengths and shapes of the first and fifth modifiable portions 113, 115, 213A, 215A and lengths and shapes of the second and fourth modifiable portions 125, 225 are different, respectively.

Other features and principles of the method for circulating a dielectric thermally conductive fluid within a single-phase immersion cooling system are generally the same as and described in detail in the embodiments of the single-phase immersion cooling system 100 above, and for sake of brevity, will not repeated hereafter.

The modifiable portions of the at least a first and second conduits 110, 120, 210, 220, 210A, 220 having different and/or same lengths and different and/or same shapes, in any combination, easily and conveniently allow users to exchange an insurmountable amount of modifiable portions, each having openings, of the heat exchanger system, to form an insurmountable amount of different flow channels for directing a flow of the dielectric thermally conductive fluid contained within the fluid-tight containment vessel 190, 199 via the disposition of the openings 119, 129, 219, 219A, 229. The increased costs, total installation time, risks for leakage, loss of parts, and total area requirements for the single-phase immersion cooling system 100 are not exacerbated when dispositions of the operating temperatures within the electric and/or electronic elements, devices and/or systems change, as easy and simple dismounting and mounting of appropriate modifiable portions easily and simply adjust the flow of the dielectric thermally conductive fluid contained within the fluid-tight containment vessel 190, 199 via the disposition of the openings 119, 129, 219, 219A, 229 for a most optimal transfer of heat.

Control of the pump, driven by an AC or DC electrical motor, preferably takes place by means of an operative system or like means or the electric and/or electronics system itself, wherein the electric and/or electronics system comprises a means for measuring load and/or temperature of one or more processors or areas. Using the measurement performed by the operative system or a like system eliminates the need for special means for operating the single-phase immersion cooling system and method of the same.

Further control strategies utilizing the operative system or a like system may involve balancing the rotational speed of the pump as a function of the cooling capacity needed. If a lower cooling capacity is needed, the rotational speed of the pump may be adjusted or limited, thereby limiting the noise generated by a motor of the pump driving the single-phase immersion cooling system and wear and tear thereof.

Functionality and applicability of electric and electronic elements, devices and systems continually increase, increasing the power requirements thereof, and in turn, increasing cooling requirements. A liquid-cooling system, wherein a heat exchanger is in thermal contact with the elements, devices and/or systems, transporting heat away therefrom, and then cooling fluid, circulating within a cooling loop system incorporating the heat exchanger, flowing over the heat exchanger by a pumping unit, removing heat therefrom, is one technique that has been developed for extracting heat from the electric and electronic elements, devices and systems. However, as operating temperatures increase so do costs, total installation time, risks for leakage, loss of parts, and total area requirements for the liquid-cooling systems. The increased costs, total installation time, risks for leakage, loss of parts, and total area requirements for the liquid-cooling systems are exacerbated when dispositions of the operating temperatures within the electric and electronic systems change.

In the embodiments, fluid cooling systems and single-phase immersion cooling systems and methods of the same, for cooling heat-generating electronic devices via circulating fluid in a fluid-tight containment vessel, comprising a fluid-tight containment vessel, dielectric thermally conductive fluid, at least a heat-generating electronic device, and heat exchanger system are provided. The heat exchanger system comprises a pump, heat exchanger, at least a first conduit, at least a second conduit, a stand, and at least a propulsion-like apparatus. The at least a first and second conduits have first and second modifiable portions comprising first and second openings submerged within the dielectric thermally conductive fluid, respectively. At least one of the at least a first conduit or second conduit circulates dielectric thermally conductive fluid from a heat exchanger outlet into the fluid-tight containment vessel and the other of the first conduit or second conduit circulates dielectric thermally conductive fluid from the fluid-tight containment vessel to a heat exchanger inlet via the pump. The first and second openings are disposed near to greatest opposing ends of the dielectric thermally conductive fluid contained within the fluid-tight containment vessel generating at least a first flow channel for directing a first flow of the dielectric thermally conductive fluid. The at least a propulsion-like apparatus moves the dielectric thermally conductive fluid from one face to an opposite face in the same direction as the first flow, supplementing and enhancing circulation within the fluid-tight containment vessel.

In the embodiments, the heat exchanger system circulates dielectric thermally conductive fluid from the heat exchanger outlet into the dielectric thermally conductive fluid contained within the fluid-tight containment vessel through at least one of a first conduit or second conduit, and circulates dielectric thermally conductive fluid contained within the fluid-tight containment vessel thereout to the heat exchanger inlet through the other of the first conduit or second conduit, supplemented and enhanced by the at least a propulsion-like apparatus, efficiently cooling heat-generating electric and/or electronic elements, devices and/or systems, decreasing a requirement for and/or requirement for an amount of cooling components, as an example, such as interface materials, heat sinks, heat sink fins, and fans etc., for cooling thereof, decreasing costs, total installation time, and total area requirements.

The removable bracket structure disposed and mounted within the fluid-tight containment vessel, configured for mounting of the heat-generating electric and/or electronic elements, devices and/or systems thereto, and the fluid-tight containment vessel comprising the containment vessel having the vessel opening and the containment cover configured to fluid-tight mount to the vessel opening, easily and simply provide access to a user for mounting of the heat-generating electric and/or electronic elements, devices and/or systems and filling of the dielectric thermally conductive fluid, decreasing total installation time. The fluid-tight cable and conduit access entrances also provides easy and simple mounting and access to a user for control cables, data cables, communications cables, signal cables, and/or power cables, from the exterior of the fluid-tight containment vessel to the interior of the fluid-tight containment vessel for access to the at least a heat-generating electronic device and/or power supply unit, respectively. Risks for leakage are also decreased as risks for a liquid-cooling system having a heat exchanger in thermal contact with the electric and/or electronic elements, devices and/or systems, transporting heat away therefrom are greater, due to leakage along any one of conduits, mounting portions, and heat exchangers of the liquid-cooling system causing damage to the non-submersible electric and/or electronic elements, devices and/or systems. The fluid-tight containment vessel also prevents contact of the heat-generating electric and/or electronic elements, devices and/or systems during operation with the surrounding environment, decreasing damage due to high temperature, high humidity, oily or dusty air, and/or salty coastal area environments.

The modifiable portions of the at least a first and second conduits, having different and/or same lengths and different and/or same shapes, in any combination, easily and conveniently allow users to exchange an insurmountable amount of modifiable portions, each having openings, of the heat exchanger system, to form an insurmountable amount of different flow channels for directing a flow of the dielectric thermally conductive fluid contained within the fluid-tight containment vessel via the disposition of the openings. The increased costs, total installation time, risks for leakage, loss of parts, and total area requirements for the single-phase immersion cooling system are not exacerbated when dispositions of the operating temperatures within the electric and/or electronic elements, devices and/or systems change, as easy and simple dismounting and mounting of appropriate modifiable portions easily and simply adjust the flow of the dielectric thermally conductive fluid contained within the fluid-tight containment vessel via the disposition of the openings for a most optimal transfer of heat.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112f unless the element or concept is expressly recited using the phrase "means for" or "step for".

Given the many possible embodiments to which the disclosed principles may be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A single-phase immersion cooling system, comprising:
   a fluid-tight containment vessel;
   a dielectric thermally conductive fluid contained within the fluid-tight containment vessel;
   at least a heat-generating electronic device submerged within the dielectric thermally conductive fluid;
   a heat exchanger system comprising:
      a pump;
      a heat exchanger having a heat exchanger inlet and a heat exchanger outlet;
      at least a first conduit having a first modifiable portion comprising a first opening submerged within the dielectric thermally conductive fluid;
      at least a second conduit having a second modifiable portion comprising a second opening submerged within the dielectric thermally conductive fluid;
      a stand; and
      at least a propulsion-like apparatus mounted to the stand,
   wherein at least one of the first conduit or second conduit circulates dielectric thermally conductive fluid from the heat exchanger outlet into the dielectric thermally conductive fluid contained within the fluid-tight containment vessel and the other of the first conduit or second conduit circulates dielectric thermally conductive fluid contained within the fluid-tight containment vessel thereout to the heat exchanger inlet, wherein the first and second openings are disposed near to greatest opposing ends of the dielectric thermally conductive fluid contained within the fluid-tight containment vessel, and wherein the at least a propulsion-like apparatus is disposed between the first and second openings and is configured to supplement the circulation of dielectric thermally conductive fluid contained within the fluid-tight containment vessel.

2. The single-phase immersion cooling system of claim 1, wherein the disposition of the first and second openings generate at least a first flow channel for directing a first flow of the dielectric thermally conductive fluid contained within the fluid-tight containment vessel.

3. The single-phase immersion cooling system of claim 2, wherein the at least a propulsion-like apparatus converts rotational movement to thrust to move dielectric thermally conductive fluid from one face of the at least a propulsion-like apparatus to an opposite face of the at least a propulsion-like apparatus, and wherein the direction of the at least a first flow channel for directing the first flow of the dielectric thermally conductive fluid contained within the fluid-tight containment vessel is the same as the direction of thrust moving dielectric thermally conductive fluid from one face of the at least a propulsion-like apparatus to the opposite face of the at least a propulsion-like apparatus.

4. The single-phase immersion cooling system of claim 1, wherein the fluid-tight containment vessel comprises a containment vessel having a vessel opening and a containment cover configured to fluid-tight mount to the vessel opening, whereby the dielectric thermally conductive fluid, at least a heat-generating electronic device, and first and second openings are contained within the fluid-tight containment vessel via the vessel opening.

5. The single-phase immersion cooling system of claim 1, wherein dielectric thermally conductive fluid comprises a single-phase fluid.

6. The single-phase immersion cooling system of claim 1, wherein the at least a heat-generating electronic device comprises at least one of a motherboard, printed circuit board, central processing unit, graphics processing unit, memory, storage device, or lighting, or any combination of the foregoing.

7. The single-phase immersion cooling system of claim 1, wherein the pump is at least submerged within the dielectric thermally conductive fluid within the fluid-tight containment vessel or mounted to an outer side of the fluid-tight containment vessel.

8. The single-phase immersion cooling system of claim 1, wherein the heat exchanger comprises a heat exchanger radiator, mounted to an outer side of the fluid-tight containment vessel.

9. The single-phase immersion cooling system of claim 7, wherein the heat exchanger further comprises at least a fan unit mounted to the heat exchanger radiator, opposite to the outer side of the fluid-tight containment vessel.

10. The single-phase immersion cooling system of claim 7, wherein the heat exchanger radiator comprises at least a built-in fluid tank reservoir having a reservoir opening, whereby dielectric thermally conductive fluid is added into the built-in fluid tank reservoir.

11. The single-phase immersion cooling system of claim 1, further comprising:
at least a fluid-tight first conduit access entrance through the fluid-tight containment vessel, configured to provide at least the first conduit from an exterior of the fluid-tight containment vessel to an interior of the fluid-tight containment vessel for access to the dielectric thermally conductive fluid contained within the fluid-tight containment vessel; and at least a fluid-tight second conduit access entrance through the fluid-tight containment vessel, configured to provide at least the second conduit from an exterior of the fluid-tight containment vessel to an interior of the fluid-tight containment vessel for access to the dielectric thermally conductive fluid contained within the fluid-tight containment vessel.

12. The single-phase immersion cooling system of claim 1, further comprising:
a power supply unit submerged within the dielectric thermally conductive fluid, configured to provide power to the at least a heat-generating electronic device;

a removable bracket structure disposed and mounted within the fluid-tight containment vessel, configured for mounting of the power supply unit and the at least a heat-generating electronic device thereto; and at least a fluid-tight cable access entrance through the fluid-tight containment vessel, configured to provide at least one of a control cable, data cable, communications cable, or signal cable, or any combination of the foregoing, from an exterior of the fluid-tight containment vessel to an interior of the fluid-tight containment vessel for further access to at least one of the at least a power supply unit and the at least a heat-generating electronic device.

13. The single-phase immersion cooling system of claim 1, further comprising:
at least a first conduit having a third modifiable portion comprising a third opening submerged within the dielectric thermally conductive fluid; and at least a second conduit having a fourth modifiable portion comprising a fourth opening submerged within the dielectric thermally conductive fluid, wherein the first modifiable portion is dismounted from the at least a first conduit and the third modifiable portion is mounted to the at least a first conduit and the second modifiable portion is dismounted from the at least a second conduit and the fourth modifiable portion is mounted to the at least a second conduit, wherein at least one of the first conduit or second conduit circulates dielectric thermally conductive fluid from the heat exchanger outlet into the dielectric thermally conductive fluid contained within the fluid-tight containment vessel and the other of the first conduit or second conduit circulates dielectric thermally conductive fluid contained within the fluid-tight containment vessel thereout to the heat exchanger inlet, wherein the third and fourth openings are disposed near to greatest opposing ends of the dielectric thermally conductive fluid contained within the fluid-tight containment vessel which are different from that of the disposition of the first and second openings, whereby the lengths and shapes of the first and third modifiable portions and lengths and shapes of the second and fourth modifiable portions are different, respectively, wherein the disposition of the third and fourth openings generate at least a third flow channel, different from the first flow channel, for directing a third flow of the dielectric thermally conductive fluid contained within the fluid-tight containment vessel, and wherein the at least a propulsion-like apparatus is disposed between the first and second openings supplementing and enhancing the circulation of dielectric thermally conductive fluid contained within the fluid-tight containment vessel.

14. The single-phase immersion cooling system of claim 1, further comprising:
at least a first conduit having a fifth modifiable portion comprising a fifth opening submerged within the dielectric thermally conductive fluid; and
at least a second conduit having a fourth modifiable portion comprising a fourth opening submerged within the dielectric thermally conductive fluid,
wherein the first modifiable portion is dismounted from the at least a first conduit and the fifth modifiable portion is mounted to the at least a first conduit and the second modifiable portion is dismounted from the at least a second conduit and the fourth modifiable portion is mounted to the at least a second conduit,
wherein at least one of the first conduit or second conduit circulates dielectric thermally conductive fluid from the heat exchanger outlet into the dielectric thermally conductive fluid contained within the fluid-tight containment vessel and the other of the first conduit or second conduit circulates dielectric thermally conductive fluid contained within the fluid-tight containment vessel thereout to the heat exchanger inlet,
wherein the fifth and fourth openings are disposed near to greatest opposing ends of the dielectric thermally conductive fluid contained within the fluid-tight containment vessel which are different from that of the disposition of the first and second openings, whereby the lengths and shapes of the first and fifth modifiable portions and lengths and shapes of the second and fourth modifiable portions are different, respectively,
wherein the disposition of the fifth and fourth openings generate at least a fifth flow channel, different from the first flow channel, for directing a fifth flow of the dielectric thermally conductive fluid contained within the fluid-tight containment vessel, and
wherein the at least a propulsion-like apparatus is disposed between the first and second openings supplementing and enhancing the circulation of dielectric thermally conductive fluid contained within the fluid-tight containment vessel.

15. The single-phase immersion cooling system of claim 1, wherein the fluid-tight containment vessel comprises at least one of a metal, plastic, or transparent plastic material, or any combination of the foregoing.

16. A single-phase immersion cooling method, comprising:
providing a fluid-tight containment vessel;
providing a dielectric thermally conductive fluid contained within the fluid-tight containment vessel;
providing at least a heat-generating electronic device submerged within the dielectric thermally conductive fluid;
providing a heat exchanger system comprising:
a pump;
a heat exchanger having a heat exchanger inlet and a heat exchanger outlet;
at least a first conduit having a first modifiable portion comprising a first opening submerged within the dielectric thermally conductive fluid;
at least a second conduit having a second modifiable portion comprising a second opening submerged within the dielectric thermally conductive fluid;
a stand; and
at least a propulsion-like apparatus mounted to the stand, circulating, via the pump, and supplementing and enhancing via the at least a propulsion-like apparatus, dielectric thermally conductive fluid from the heat exchanger outlet into the dielectric thermally conductive fluid contained within the fluid-tight containment vessel through at least one of the first conduit or second conduit; and
circulating, via the pump, dielectric thermally conductive fluid contained within the fluid-tight containment vessel thereout to the heat exchanger inlet through the other of the first conduit or second conduit,
wherein the first and second openings are disposed near to greatest opposing ends of the dielectric thermally conductive fluid contained within the fluid-tight containment vessel, and
wherein the at least a propulsion-like apparatus is disposed between the first and second openings and is configured to supplement the circulation of dielectric thermally conductive fluid contained within the fluid-tight containment vessel.

17. The single-phase immersion cooling method of claim 16, further comprising:
generating at least a first flow channel for directing a first flow of the dielectric thermally conductive fluid contained within the fluid-tight containment vessel via the disposition of the first and second openings.

18. The single-phase immersion cooling method of claim 17, further comprising:
providing at least a first conduit having a third modifiable portion comprising a third opening submerged within the dielectric thermally conductive fluid; and
providing at least a second conduit having a fourth modifiable portion comprising a fourth opening submerged within the dielectric thermally conductive fluid,
dismounting the first modifiable portion from the at least a first conduit and mounting the third modifiable portion to the at least a first conduit;
dismounting the second modifiable portion from the at least a second conduit and mounting the fourth modifiable portion to the at least a second conduit;
circulating, via the pump, dielectric thermally conductive fluid from the heat exchanger outlet into the dielectric thermally conductive fluid contained within the fluid-tight containment vessel through at least one of the first conduit or second conduit; and
circulating, via the pump, dielectric thermally conductive fluid contained within the fluid- tight containment vessel thereout to the heat exchanger inlet through the other of the first conduit or second conduit,
generating at least a third flow channel for directing a third flow of the dielectric thermally conductive fluid contained within the fluid-tight containment vessel via the disposition of the third and fourth openings,
wherein the third and fourth openings are disposed near to greatest opposing ends of the dielectric thermally conductive fluid contained within the fluid-tight containment vessel which are different from that of the disposition of the first and second openings, whereby the lengths and shapes of the first and third modifiable portions and lengths and shapes of the second and fourth modifiable portions are different, respectively.

19. The single-phase immersion cooling method of claim 17, further comprising:

providing at least a first conduit having a fifth modifiable portion comprising a fifth opening submerged within the dielectric thermally conductive fluid; and providing at least a second conduit having a fourth modifiable portion comprising a fourth opening submerged within the dielectric thermally conductive fluid, dismounting the first modifiable portion from the at least a first conduit and mounting the fifth modifiable portion to the at least a first conduit;

dismounting the second modifiable portion from the at least a second conduit and mounting the fourth modifiable portion to the at least a second conduit;

circulating, via the pump, dielectric thermally conductive fluid from the heat exchanger outlet into the dielectric thermally conductive fluid contained within the fluid-tight containment vessel through at least one of the first conduit or second conduit; and circulating, via the pump, dielectric thermally conductive fluid contained within the fluid- tight containment vessel thereout to the heat exchanger inlet through the other of the first conduit or second conduit, generating at least a fifth flow channel for directing a fifth flow of the dielectric thermally conductive fluid contained within the fluid-tight containment vessel via the disposition of the fifth and fourth openings, wherein the fifth and fourth openings are disposed near to greatest opposing ends of the dielectric thermally conductive fluid contained within the fluid-tight containment vessel which are different from that of the disposition of the first and second openings, whereby the lengths and shapes of the first and fifth modifiable portions and lengths and shapes of the second and fourth modifiable portions are different, respectively.

\* \* \* \* \*